(12) United States Patent
Tonari et al.

(10) Patent No.: US 9,496,267 B2
(45) Date of Patent: Nov. 15, 2016

(54) METHOD FOR MANUFACTURING SEMICONDUCTOR DEVICE

(71) Applicant: PS4 Luxco S.a.r.l., Luxembourg (LU)

(72) Inventors: Kazuaki Tonari, Tokyo (JP); Yuki Togashi, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/890,875

(22) PCT Filed: May 9, 2014

(86) PCT No.: PCT/JP2014/062507
§ 371 (c)(1),
(2) Date: Nov. 12, 2015

(87) PCT Pub. No.: WO2014/185360
PCT Pub. Date: Nov. 20, 2014

(65) Prior Publication Data
US 2016/0118388 A1 Apr. 28, 2016

(30) Foreign Application Priority Data
May 13, 2013 (JP) .................. 2013-101318

(51) Int. Cl.
*H01L 27/108* (2006.01)
*H01L 29/423* (2006.01)
(Continued)

(52) U.S. Cl.
CPC ... *H01L 27/10855* (2013.01); *H01L 21/76897* (2013.01); *H01L 27/10823* (2013.01);
(Continued)

(58) Field of Classification Search
None
See application file for complete search history.

(56) References Cited

U.S. PATENT DOCUMENTS

| | | |
|---|---|---|
| 5,183,781 A | 2/1993 | Nakano |
| 2011/0189828 A1* | 8/2011 | Sako .................. H01L 21/28 438/239 |

(Continued)

FOREIGN PATENT DOCUMENTS

| | | |
|---|---|---|
| JP | 2013093512 | 5/2013 |
| JP | 2013201414 | 10/2013 |

OTHER PUBLICATIONS

Application No. PCT/JP2014/062507, International Search Report, Aug. 12, 2014.

*Primary Examiner* — Khaja Ahmad
(74) *Attorney, Agent, or Firm* — Kunzler Law Group, PC

(57) ABSTRACT

In one device, a first space partitioned by first and second line patterns is filled with a multilayer film that is composed of a first silicon film having a high impurity concentration relative to a standard plug impurity concentration and a second silicon film having a low impurity concentration relative to the standard plug impurity concentration, and is divided by forming a groove using a mask film on the side wall of the second line pattern. As a result, expansion of a seam, which is formed only on the second silicon film having a low impurity concentration, is suppressed. After that, an isolation insulating film is embedded in the groove and impurity diffusion is carried out by a heat treatment, so that divided plugs as a whole are made to have the standard plug impurity concentration.

19 Claims, 30 Drawing Sheets

(51) Int. Cl.
*H01L 29/66* (2006.01)
*H01L 21/768* (2006.01)

(52) U.S. Cl.
CPC ... *H01L 27/10876* (2013.01); *H01L 27/10885* (2013.01); *H01L 29/4236* (2013.01); *H01L 29/66795* (2013.01); *H01L 27/10891* (2013.01)

(56) References Cited

U.S. PATENT DOCUMENTS

2011/0260288 A1* 10/2011 Sukekawa ......... H01L 21/76897
 257/532
2013/0240966 A1* 9/2013 Hamada ............ H01L 27/10805
 257/296

\* cited by examiner (a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(A)

(E)

METHOD FOR MANUFACTURING SEMICONDUCTOR DEVICE

TECHNICAL FIELD

The present invention relates to a method of manufacturing a semiconductor device, and in particular relates to a method of manufacturing fine contact plugs.

BACKGROUND

In cells of semiconductor devices such as a DRAM (Dynamic Random Access Memory), device miniaturization has led to the need to form fine contact plugs. Patent literature article 1 discloses a method of forming two adjacent fine contact plugs (referred to as twin plugs hereinafter).

In the method of forming twin plugs disclosed in patent literature article 1, first a large space corresponding to the size of two contacts is opened between wiring lines, and is filled with a plug material such as doped polysilicon. The actual plug portions are then masked and are separated by etching, and the separating portion is filled with an insulating film (referred to as an isolating and insulating film).

PATENT LITERATURE

Patent literature article 1: Japanese Patent Kokai 2011-243960

SUMMARY OF THE INVENTION

Problems to be Resolved by the Invention

In the prior art, the space part formed between the wiring lines is formed in the shape of a rectangle, in such a way as to form a space corresponding to the size of two contacts in the direction in which the wiring lines extend. Meanwhile, doped polysilicon is liable to be deposited conformally, and thus when the space part corresponding to the size of two contacts is filled, a joint known as a seam is liable to form in the direction in which the wiring lines extend. In order to form a dividing mask, the doped polysilicon is etched back such that it is lower than the upper surfaces of insulating line patterns that are higher than the wiring lines, in order to expose the sidewalls of the insulating line patterns. At this time, the seam part is more readily etched than other parts, and the seam generated in the central portion thereof is thus etched, forming a slit (void). If the dividing mask is formed from an insulating film, the insulating film forms penetrating into the void. As a result, if the length of the void is longer than the separating width, in some cases the insulating film that has penetrated into the void remains, the surface areas of the upper surfaces of the separated contacts decrease, and the contact resistance increases, resulting in high-resistance defects. There is thus scope for further improvement in the prior art.

Means of Overcoming the Problems

In the present invention, in order to resolve the above-mentioned problems, a two-layer configuration comprising high-concentration polysilicon and low-concentration polysilicon is employed in the space portion between the wiring lines, suppressing increases in the slit size, and thereby suppressing the generation of residual insulating film and suppressing reductions in the contact surface area.

To elaborate, one mode of embodiment of the present invention relates to a method of manufacturing a semiconductor, characterized in that it is provided with:

a step of demarcating a first space portion by means of a plurality of first line patterns extending in a first direction, and a plurality of second line patterns extending over the plurality of first line patterns in a second direction which intersects the first direction;

a step of depositing a first silicon film, containing an impurity having a first concentration, to a thickness that does not fill the first space portion;

a step of depositing a second silicon film, containing an impurity having a second concentration, to a thickness that fills the first space portion and fills between the second line patterns;

a step of forming a silicon filler body by etching back the first and second silicon films in such a way as to make them lower than an upper surface of the second line pattern;

a step of forming masking films on each of the sidewalls of the second line patterns in such a way that a portion of the silicon filler body is exposed;

a step of selectively removing the silicon filler body, using the masking film as a mask, to form a groove;

a step of filling the groove with an isolating and insulating film;

a step of removing the masking film, a portion of the isolating and insulating film, and portions of the second line patterns in such a way that the upper surfaces of the silicon filler body that has been divided by the isolating and insulating film are exposed; and a step of forming a groove in the silicon filler body, and then employing heat treatment to bring the impurity concentration in the divided silicon filler body to a third concentration; and in that the first concentration is higher than the third concentration, and the second concentration is lower than the third concentration.

Advantages of the Invention

According to one mode of embodiment of the present invention, a first silicon film having a first concentration that is higher than a third concentration, being a standard impurity concentration in a silicon plug, serves as an underlying film, a second silicon film having a second concentration that is lower than the third concentration is embedded on the first silicon film as an embedded film, into a space corresponding at least to the size of two plugs, and is then divided into two plugs. As a result, only a joint in the second silicon film having the second concentration is exposed at the dividing surface, and therefore side etching of the joint can be suppressed to a greater extent than if a silicon film having the third concentration is embedded, voids that form can be made smaller, and even if the isolating and insulating film is subsequently embedded, reductions in the contact surface area can be suppressed by reducing the amount of the insulating film that penetrates into the small voids.

MODES OF EMBODYING THE INVENTION

Modes of embodying the present invention will now be described with reference to the drawings.

FIGS. 1 to 9 illustrate a semiconductor device according to one mode of embodiment of the present invention, in particular a method of forming twin plugs, where in each drawing, (c) is a top view in the respective step, (a) is a cross-sectional view through X-X' in (c), and (b) is a cross-sectional view through Y-Y' in (c).

Figure 1:
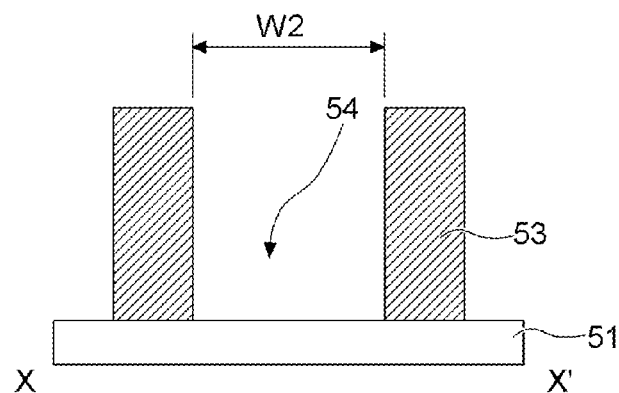
FIG. 1 is a drawing used to describe a step in the manufacture of twin plugs in one mode of embodiment of the present invention, where (a) is a cross-sectional view through X-X' in (c), (b) is a cross-sectional view through Y-Y' in (c), and (c) is a top view.
Figure 1:
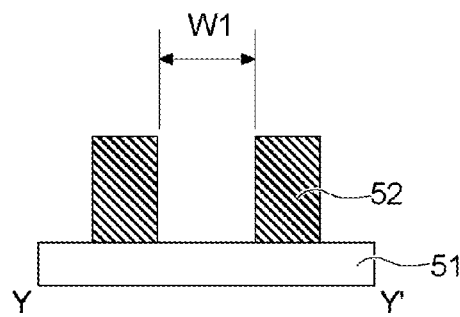
Figure 1:
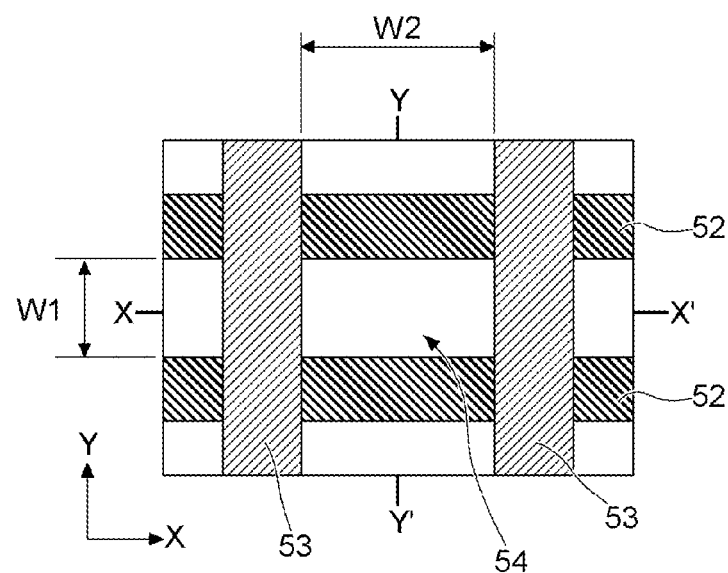

First, as illustrated in FIG. 1, a plurality of first line patterns 52 are formed extending in the X-direction (first direction) on a substrate 51, and a plurality of second line patterns 53 are formed extending over the first line patterns 52 in the Y-direction (second direction). The height of the second line patterns 53 is adjusted in such a way as to optimize the width of a mask side wall used to form a groove in a sacrificial film in a subsequent step. An exposed part of the substrate enclosed by two adjacent first line patterns 52 and two adjacent second line patterns 53 is referred to as a first space portion 54. It should be noted that the obverse surfaces of the first line patterns 52 and the second line patterns 53 come into contact with twin plugs (first and second contact plugs discussed hereinafter) that are ultimately formed, and therefore the first line patterns 52 and the second line patterns 53 are formed from an insulating material. For example, wiring line patterns in which the upper surfaces and both side surfaces of wiring lines formed on the substrate 51 are covered by an insulating film can be employed as the first line patterns 52. Further, lower layer conductors to which each twin plug is connected exist at the bottom of the first space portion 54, in other words on the obverse surface portion of the substrate 51, but these are omitted from the drawing. Further, the drawings describe a case in which the first line patterns 52 and the second line patterns 53 both have vertical wall surfaces, but one or both may have wall surfaces that are inclined in such a way as to become wider with increasing height. In addition, an example is presented in which the first line patterns 52 and the second line patterns 53 intersect at right angles, but the configuration is not limited to this. It should be noted that the relationship between the width in the X-direction (a gap W2 between the second line patterns 53) and the width in the Y-direction (a gap W1 between the first line patterns 52) of the first space portion 54 is normally set such that W2−WS>W1, where WS is the width, in the X-direction, of a silicon groove formed in a subsequent step, in order that the seam in question is exposed in the wall surface of the silicon groove. Preferably W2≥1.5×W1, and WS is a width at most equal to the minimum processing dimension F, which is the resolution limit in lithography. Here, W1, W2 and WS each represent widths in an identical plane.

Figure 2:
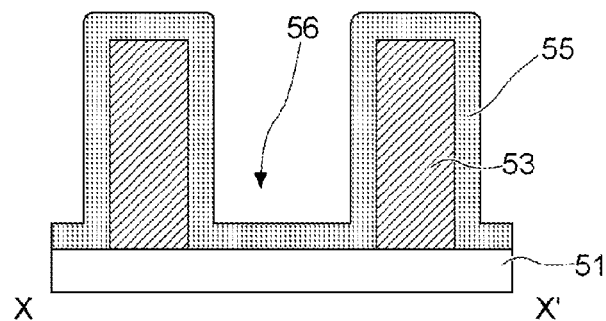
FIG. 2 is a drawing used to describe a step in the manufacture of twin plugs in one mode of embodiment of the present invention, where (a) is a cross-sectional view through X-X' in (c), (b) is a cross-sectional view through Y-Y' in (c), and (c) is a top view.
Figure 2:
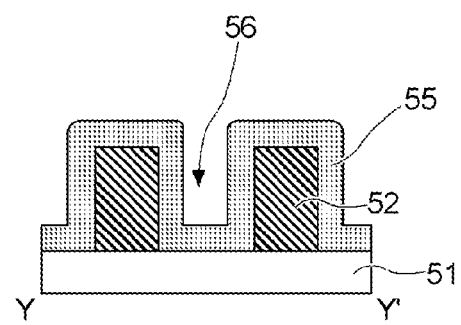
Figure 2:
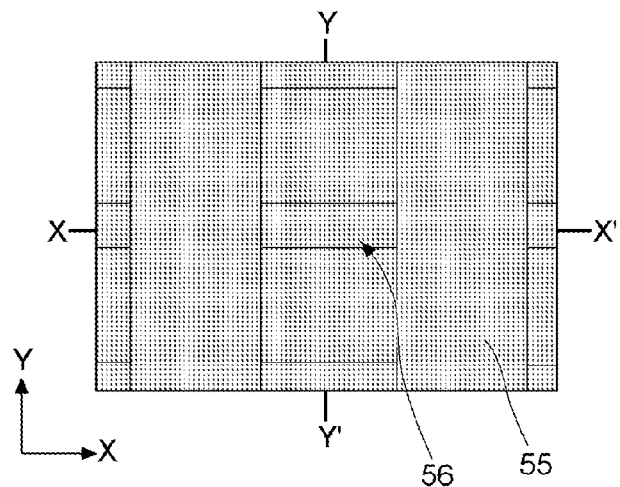

Next, as illustrated in FIG. 2, a first silicon film 55 is formed to a thickness that does not fill the first space portion 54. The first silicon film 55 is a doped silicon film containing an impurity having a first concentration, and is deposited as an amorphous silicon film or a polysilicon film. The first concentration is preferably higher than the amount of impurity (referred to as a third concentration) normally introduced into a silicon plug. A recess remaining after the first silicon film 55 has been formed is referred to as a second space portion 56. The thickness of the first silicon film 55 is preferably at most equal to ¼ of the lateral-direction width (W1) of the first space portion 54. As a result, the second space portion 56 can retain at least half of the lateral-direction width of the original first space portion 54, and a deterioration in the ease with which a second silicon film is embedded, in the next step, can be suppressed. However, if the first silicon film 55 is too thin, the amount of impurity diffused into the second silicon film formed in the next step is reduced, and it is therefore not preferable for the first silicon film 55 to be made excessively thin. Said thickness is preferably at least equal to ⅒ of the lateral-direction width of the first space portion 54. Taking into account film thickness uniformity within the plane of the wafer, the thickness of the first silicon film 55 is preferably at least equal to 5 nm.

Figure 3:
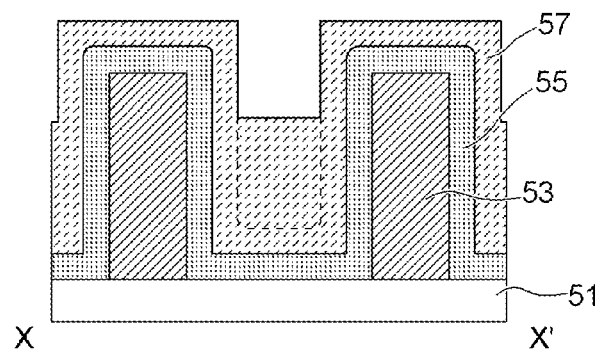
FIG. 3 is a drawing used to describe a step in the manufacture of twin plugs in one mode of embodiment of the present invention, where (a) is a cross-sectional view through X-X' in (c), (b) is a cross-sectional view through Y-Y' in (c), and (c) is a top view.
Figure 3:
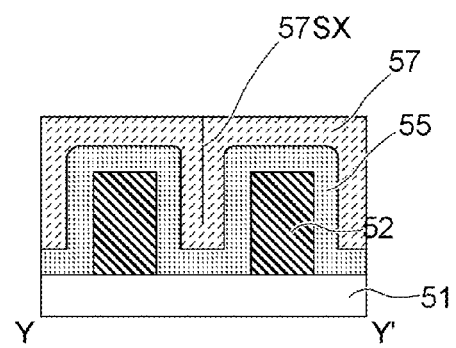
Figure 3:
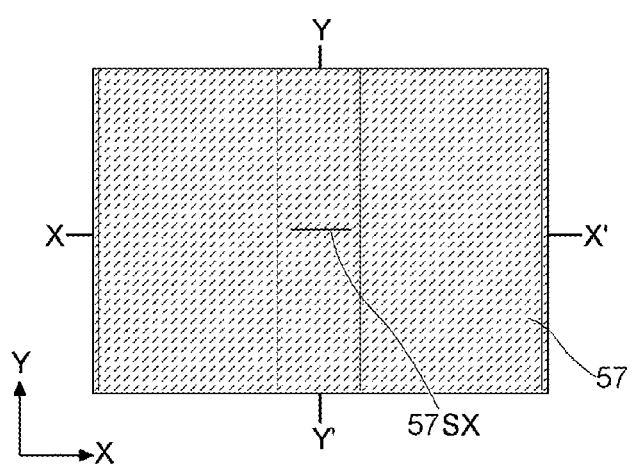
Figure 4:
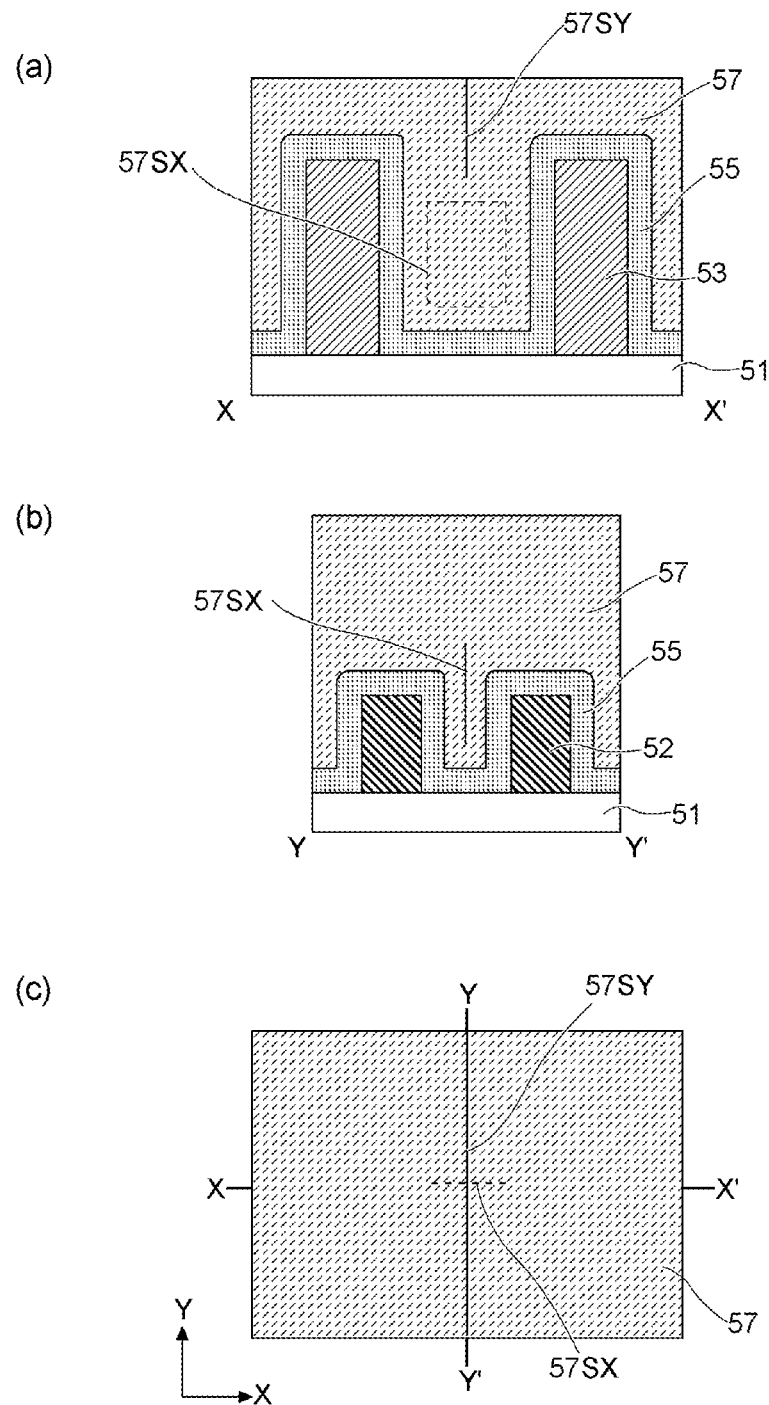
FIG. 4 is a drawing used to describe a step in the manufacture of twin plugs in one mode of embodiment of the present invention, where (a) is a cross-sectional view through X-X' in (c), (b) is a cross-sectional view through Y-Y' in (c), and (c) is a top view.

Next, as illustrated in FIG. 3 and FIG. 4, a second silicon film 57 is formed filling the second space portion 56. The second silicon film 57 is deposited as an amorphous silicon film or a polysilicon film having a lower concentration than the third concentration. The impurity concentration in the second silicon film 57 is referred to as a second concentration. The second concentration includes cases in which there is essentially no impurity, in other words non-doped cases. It should be noted that the first to third concentrations are discussed hereinafter. Joints (seams) form in the second silicon film 57 during deposition thereof. First, when the second silicon film 57 has been deposited to a thickness filling the second space portion 56, a first seam 57SX extending in the X-direction forms as a result of growth in the direction of the side surfaces between the first line patterns 52, as illustrated in FIG. 3. Then, as deposition continues further, for a short period of time a film with no seam forms above the first seam 57SX, and then, as illustrated in FIG. 4, a second seam 57SY extending in the Y-direction forms as a result of growth in the direction of the side surfaces between the second line patterns 53.

Figure 5:
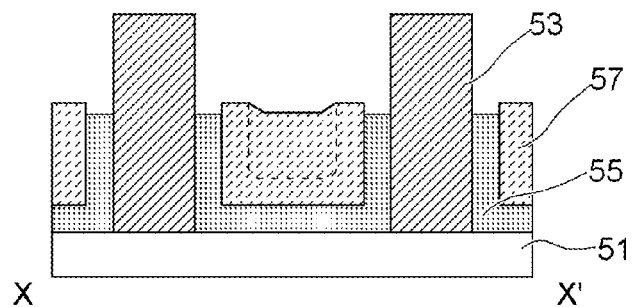
FIG. 5 is a drawing used to describe a step in the manufacture of twin plugs in one mode of embodiment of the present invention, where (a) is a cross-sectional view through X-X' in (c), (b) is a cross-sectional view through Y-Y' in (c), and (c) is a top view.
Figure 5:
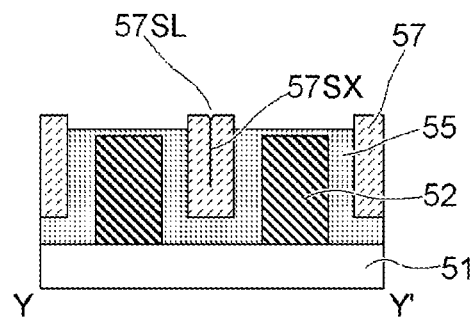
Figure 5:
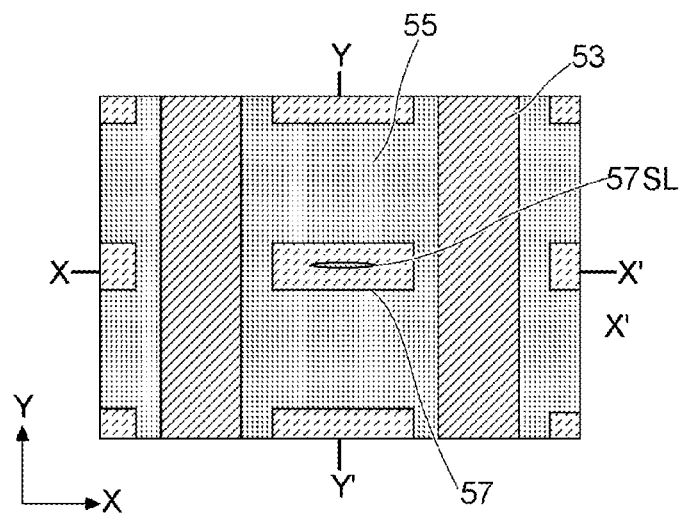

Next, as illustrated in FIG. 5, the second silicon film 57 and the first silicon film 55 are etched back in such a way as to expose upper portions of the second line patterns 53. Here, an example is illustrated in which etch-back is performed to an extent whereby the upper surfaces of the first line patterns 52 are not exposed, but the upper surfaces of the first line patterns 52 may be exposed. Further, the first silicon film 55 contains a larger amount of impurity than the second silicon film 57, and is therefore more readily etched, and thus a step forms. The size of this step tends to increase as the difference between the first concentration and the third concentration increases. The step is depicted in an exaggerated manner in the drawings. At this time, the second seam 57SY is removed entirely, the first seam 57SX is exposed, and a slit 57SL forms in an upper portion of the first seam 57SX.

Figure 6:
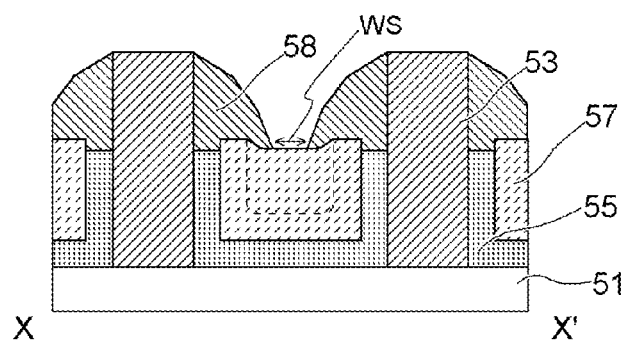
FIG. 6 is a drawing used to describe a step in the manufacture of twin plugs in one mode of embodiment of the present invention, where (a) is a cross-sectional view through X-X' in (c), (b) is a cross-sectional view through Y-Y' in (c), and (c) is a top view.
Figure 6:
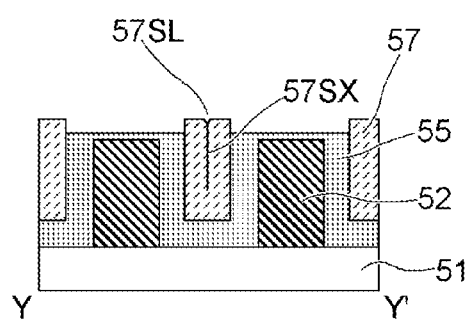
Figure 6:
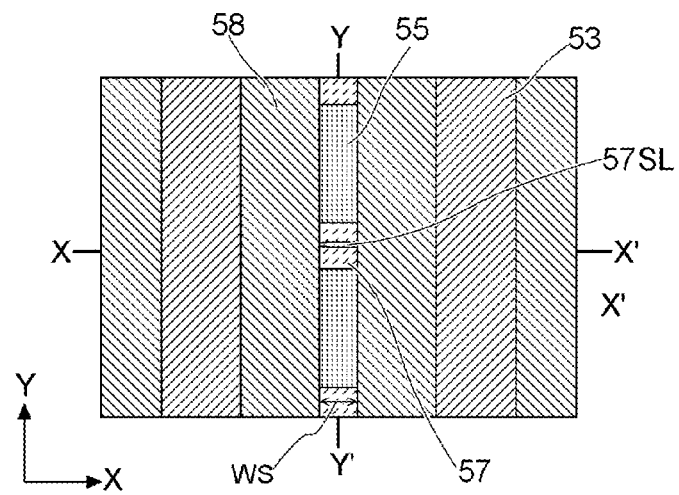

Then, as illustrated in FIG. 6, mask side walls 58 are formed on the side walls of the second line patterns 53, as a masking film used to divide the second silicon film 57 and the first silicon film 55 to form a silicon groove having a width WS.

Figure 7:
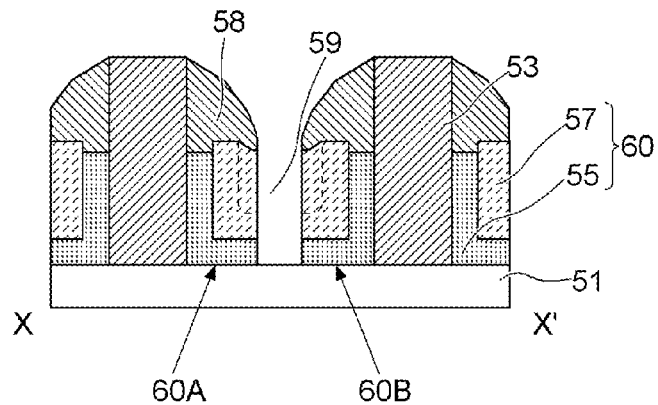
FIG. 7 is a drawing used to describe a step in the manufacture of twin plugs in one mode of embodiment of the present invention, where (a) is a cross-sectional view through X-X' in (c), (b) is a cross-sectional view through Y-Y' in (c), and (c) is a top view.
Figure 7:
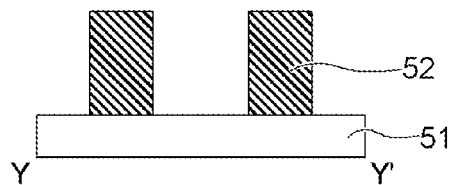
Figure 7:
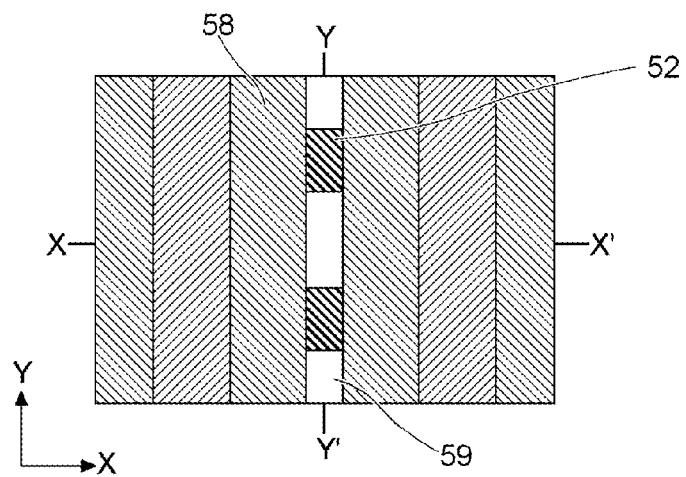

Then, as illustrated in FIG. 7, the second silicon film 57 and the first silicon film 55 exposed between the mask side walls 58 are selectively removed, using the mask side walls 58 as a mask, to form a silicon groove 59. Two contact plugs 60 (a first contact plug 60A and a second contact plug 60B) are divided within the first space portion 54 by the silicon groove 59.

If a doped silicon film having a certain concentration (third concentration) is deposited in a single step, as in the background art, even in this groove-forming stage side-etching of the seam part exposed in the sidewalls of the groove progresses and voids are formed, but in the present invention the seam is only formed in the second silicon film in which the amount of impurity is low, and therefore the effects of side-etching in the seam part are small, and the generation of voids is suppressed.

Figure 8:
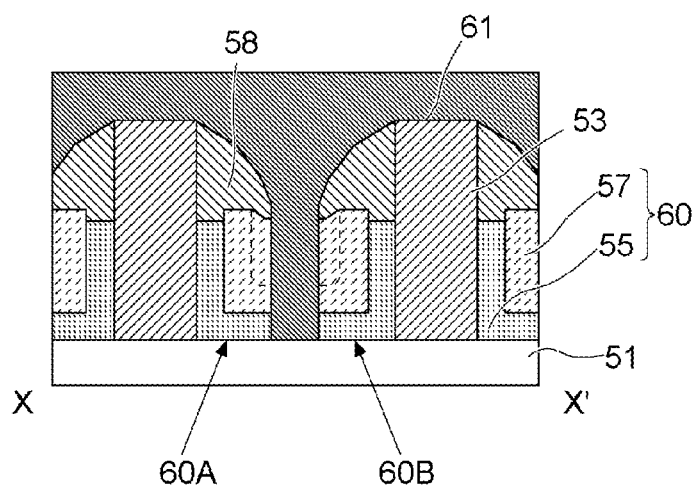
FIG. 8 is a drawing used to describe a step in the manufacture of twin plugs in one mode of embodiment of the present invention, where (a) is a cross-sectional view through X-X' in (c), (b) is a cross-sectional view through Y-Y' in (c), and (c) is a top view.
Figure 8:
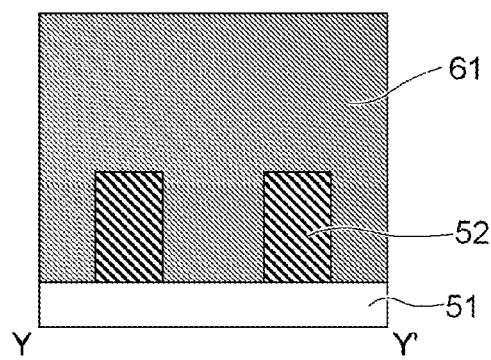
Figure 8:
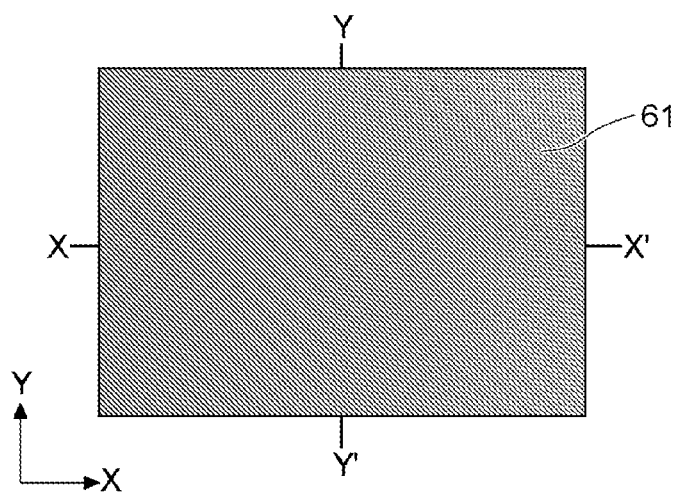

As illustrated in FIG. 8, an isolating and insulating film 61 is then formed over the entire surface, filling the groove 59.

Figure 9:
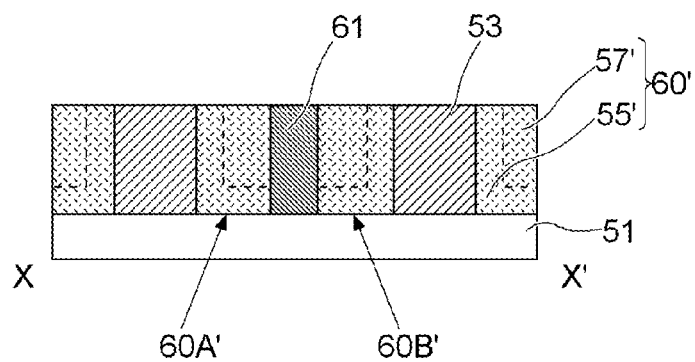
FIG. 9 is a drawing used to describe a step in the manufacture of twin plugs in one mode of embodiment of the present invention, where (a) is a cross-sectional view through X-X' in (c), (b) is a cross-sectional view through Y-Y' in (c), and (c) is a top view.
Figure 9:
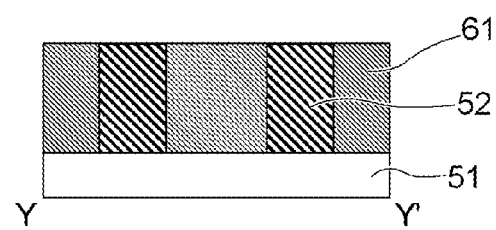
Figure 9:
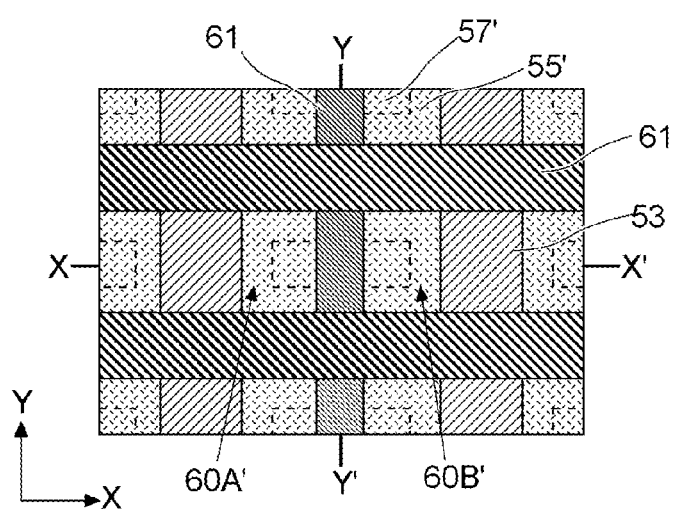

Next, as illustrated in FIG. 9, the isolating and insulating film 61, the mask side walls 58 and the second line patterns 53 are etched back to expose the upper surfaces of the contact plugs 60A and 60B, and heat treatment is performed to cause impurities to diffuse from the first silicon film 55 to the second silicon film 57. The first silicon film 55 and the second silicon film 57 after impurity diffusion are referred to respectively as the first silicon film 55' and the second silicon film 57', and the contact plugs 60 are referred to as the contact plugs 60'. By this means it is possible to complete the first and second contact plugs 60N and 60W in the first space portion 54.

It should be noted that diffusion of impurities from the first silicon film 55 to the second silicon film 57 can be performed at any stage after the groove 59 illustrated in FIG. 6 has been formed, and a separate heat treatment step for impurity diffusion may be provided, or another heat treatment step may be utilized. In the process in FIG. 9 a case is illustrated in which etch-back is implemented after heat treatment, and thus, because the impurity concentration in the first silicon film 55' and the second silicon film 57' has been homogenized to the third concentration, said films are etched back without a step being formed. Meanwhile, if etch-back is performed prior to heat treatment, the amount by which the first silicon film 55 is etched back increases, and contact plugs having a characteristic step at the surface thereof can be formed.

The first to third concentrations will now be described. The first to third concentrations are related as follows.
First concentration=C1, second concentration=C2, third concentration=C3 (atom/cm$^3$)
Volume fraction of first silicon film in final contact plug= V1 (%)
Volume fraction of second silicon film in final contact plug=V2 (%)

$$C1>C3>C2$$

$$V1+V2=100\%$$

$$C1 \times V1 + C2 \times V2 = C3$$

For example, if the final contact plug is a 50×50×200 nm cuboid, and the first silicon film is formed to a thickness of 10 nm, then the size of the second silicon film part is 30×40×190 nm, and therefore:

$$V1=54.4\%$$

$$V2=45.6\%$$

If C3 is 7E20 (atom/cm$^3$) and C2 is 5E20 (atom/cm$^3$), then C1 is approximately 8.7E20 (atom/cm$^3$).

The present invention suppresses slit expansion by employing the second silicon film (C2), which is less readily etched than the doped silicon film (C3) conventionally formed in a single step, and although the etching rate cannot be specified using a sweeping generalization, as it depends on the state of the silicon film (amorphous silicon or polysilicon), the type of ions introduced, and the etching method, the effect of suppressing slit expansion increases if the concentration C2 is at least 15% lower than C3, and preferably at least 20% lower than C3. If the introduced ions are phosphorus (P), then C3 is normally at least equal to 6E20 (atom/cm$^3$), and preferably at least equal to 7E20 (atom/cm$^3$), and C2 is less than 6E20 (atom/cm$^3$), and preferably at most equal to 5E20 (atom/cm$^3$). Further, as described hereinabove, it is possible for the second silicon film to be essentially non-doped (C2=0), but in this case the impurity concentration (C1) in the first silicon film must be increased by a corresponding amount. Depending on the location in which the contact plugs are formed, in some cases it is not possible for the impurity concentration (C1) in the silicon film to be made sufficiently high. For example, when connecting to a diffusion layer in a semiconductor substrate, such as a cell contact plug of a DRAM, as in the exemplary embodiment discussed hereinafter, if the impurity concentration (C1) in the first silicon film is excessively high, then impurities also diffuse into the diffusion layer on the substrate side during thermal diffusion of impurities into the second silicon film, and this gives rise to adverse effects such as an increase in the depth of the diffusion layer junction. Therefore in such cases it is preferable for the impurity also to be introduced, to some extent, into the second silicon film, to prevent the amount of impurity introduced into the first silicon film from becoming extremely high.

The method of the present invention is particularly effective in cases in which a slight reduction in the contact surface area is a problem, when forming fine contacts in which the length of the short edge of the contact plugs being formed is in the vicinity of the minimum processing dimension (F value).

Exemplary embodiments of the present invention will now be described in detail with reference to the drawings. In the following exemplary embodiments, descriptions are provided of cases relating to the manufacture of cell contact plugs in memory cells, but the present invention is not restricted thereto, and can also be applied to cases in which the pitch of an upper layer and a lower layer in the contact plug are different, or to contact plugs which must be formed with a fine pitch.

Exemplary Embodiment 1

A method of manufacturing exemplary embodiment 1 of the present invention will be described with reference to FIG. 10 to FIG. 29.

In a plane parallel to the semiconductor substrate, the X-direction, and the Y-direction which intersects the X-direction at right angles, are defined as illustrated in FIG. 9 (C). The direction in which an element-forming region A of a memory cell extends is defined as an α-direction, and a direction which intersects the α-direction at right angles is defined as a β-direction, as illustrated in FIG. 9 (C). Further, the direction perpendicular to the semiconductor substrate is the Z-direction. It should be noted that in the present invention, if the X-direction is defined as a first direction, then the Y-direction is a second direction, the α-direction is a third direction, and the β-direction is a fourth direction.

Sub-Figures (C) in FIG. 10 to FIG. 22 and FIGS. 25 to 28 are top views of each respective step.

Figure 22:
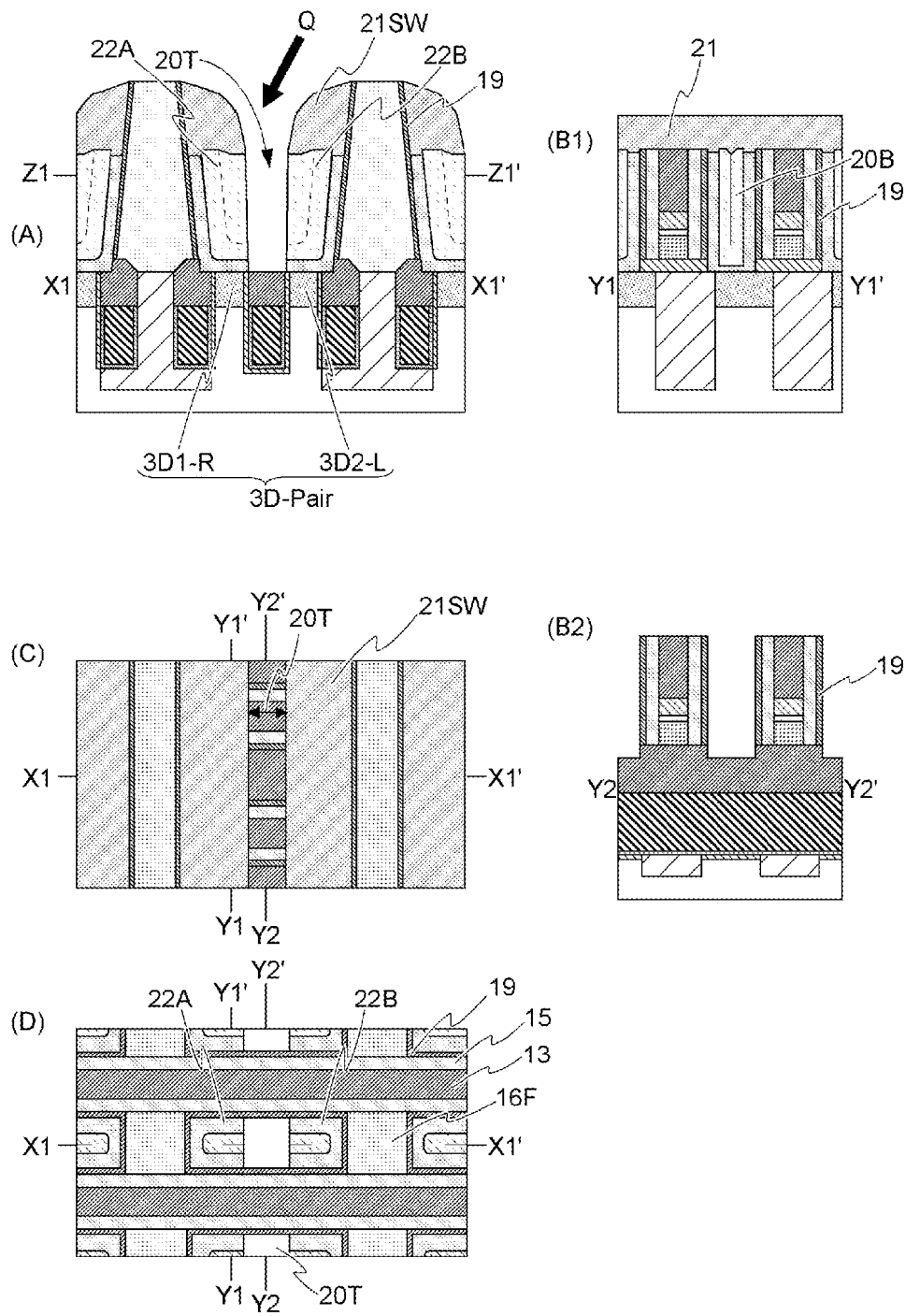
FIG. 22 is a drawing used to describe a step in the manufacture of a semiconductor device in one exemplary embodiment of the present invention, where (A) is a cross-sectional view through X1-X1' in (C) or (D), (B1) is a cross-sectional view through Y1-Y1' in (C) or (D), (B2) is a cross-sectional view through Y2-Y2' in (C), (C) is a top view, and (D) is a cross-sectional view through Z1-Z1' in (A).
Figure 24:
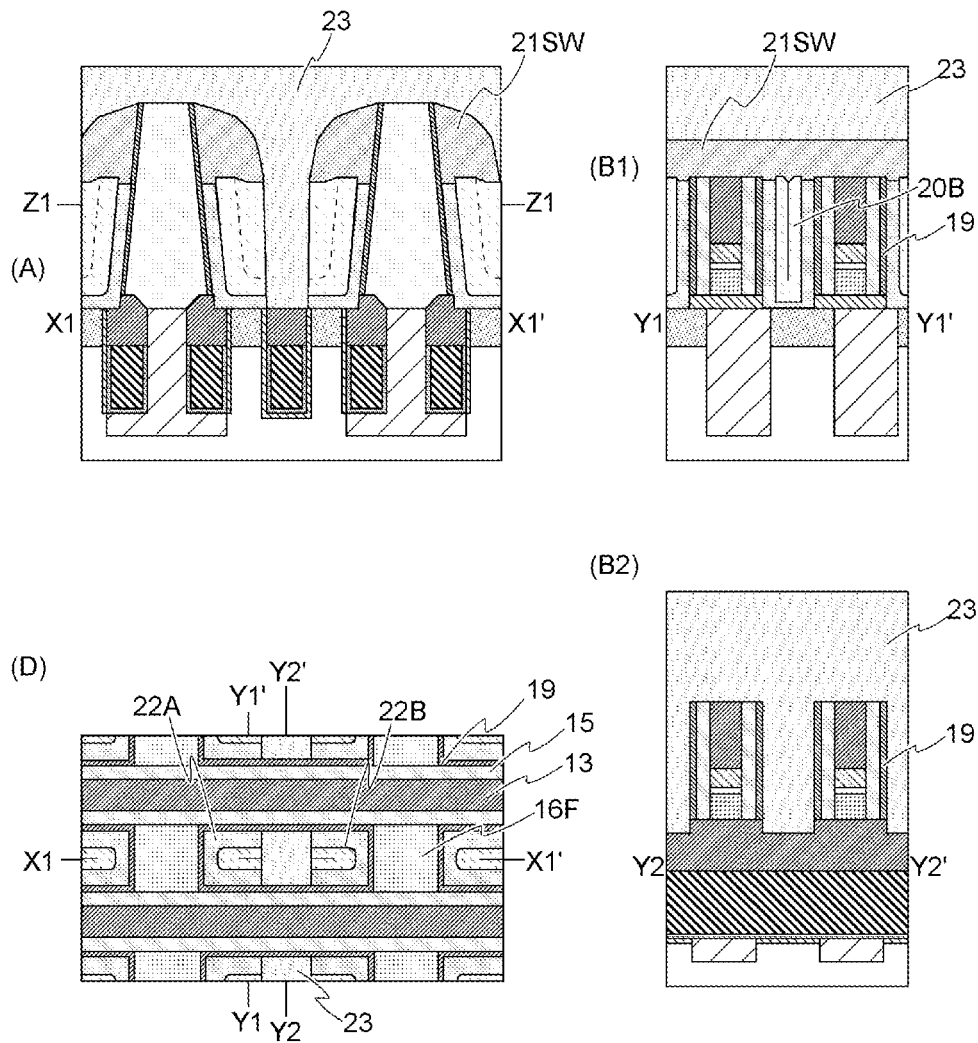
FIG. 24 is a drawing used to describe a step in the manufacture of a semiconductor device in one exemplary embodiment of the present invention, where (A) is a cross-sectional view through X1-X1' in (D), (B1) is a cross-sectional view through Y1-Y1' in (D), (B2) is a cross-sectional view through Y2-Y2' in (D), and (D) is a cross-sectional view through Z1-Z1' in (A).
Figure 25:
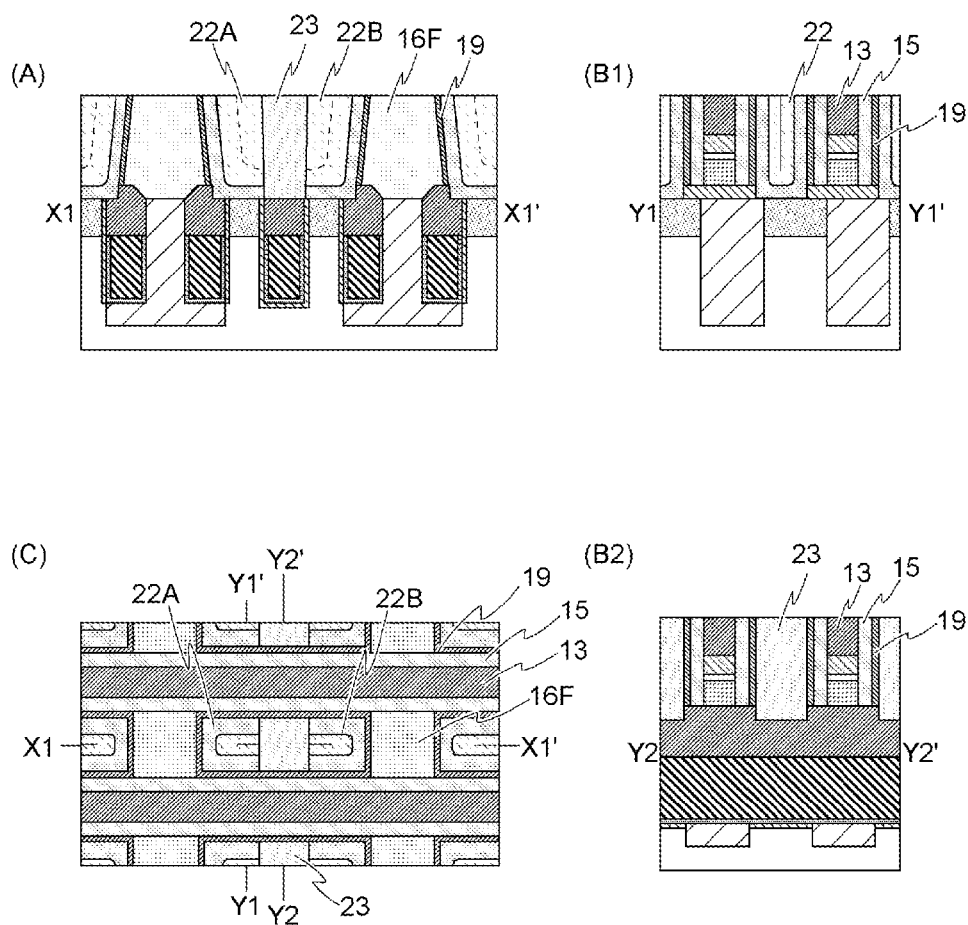
FIG. 25 is a drawing used to describe a step in the manufacture of a semiconductor device in one exemplary embodiment of the present invention, where (A) is a cross-sectional view through X1-X1' in (C), (B1) is a cross-sectional view through Y1-Y1' in (C), (B2) is a cross-sectional view through Y2-Y2' in (C), and (C) is a top view.

FIG. 22 (D), FIG. 24 (D) and FIG. 25 (D) are cross-sectional views parallel to the semiconductor substrate when cut through Z1-Z1' in FIG. 22 (A), FIG. 24 (A) and FIG. 25 (A) respectively.

In FIG. 10 to FIG. 22 and FIG. 24 to FIG. 28, (A) is a cross-sectional view perpendicular to the semiconductor substrate when cut through the line X1-X1' in the X-direction, illustrated in Figure (C) or (D). Further, Figure (B) or (B1) is a cross-sectional view perpendicular to the semiconductor substrate when cut through the line Y1-Y1' in the Y-direction, illustrated in Figure (C) or (D). Figure (B2) is a cross-sectional view perpendicular to the semiconductor substrate when cut through the line Y2-Y2' in the Y-direction, illustrated in Figure (C) or (D). FIG. 29 (A) is a cross-sectional view perpendicular to the semiconductor substrate when cut through the line X1-X1' in FIG. 29 (E), and FIG. 29 (E) is a top view as seen through a portion of the insulating film.

Figure 10:
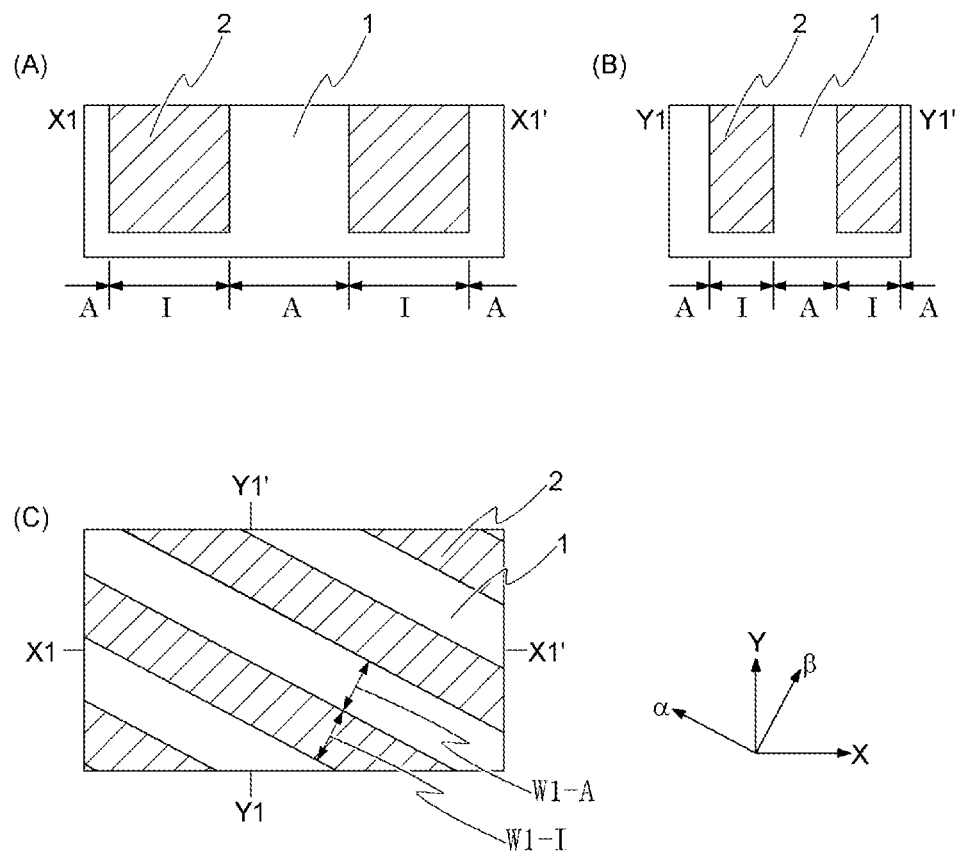
FIG. 10 is a drawing used to describe a step in the manufacture of a semiconductor device in one exemplary embodiment of the present invention, where (A) is a cross-sectional view through X1-X1' in (C), (B) is a cross-sectional view through Y1-Y1' in (C), and (C) is a top view.

[Step in FIG. 10]

Element isolation regions I comprising element isolating films 2 are formed in a semiconductor substrate 1. A silicon substrate is used as the semiconductor substrate 1, and silicon dioxide films are used as the element isolating films 2. Element-forming regions A comprising the semiconductor substrate 1 are demarcated, partitioned by the element isolation regions I. The element-forming regions A have a planar shape which extends in the α-direction, inclined from the X-direction, and are disposed in a repeating manner with a prescribed spacing in the β-direction. It should be noted that a p-type semiconductor substrate is used in this exemplary embodiment. As seen in a plan view, the width W1-I of the element isolation regions is 50 nm, and the width W1-A of the element-forming regions is 50 nm. Further, the depth of the element isolating films 2 is 300 nm.

Figure 11:
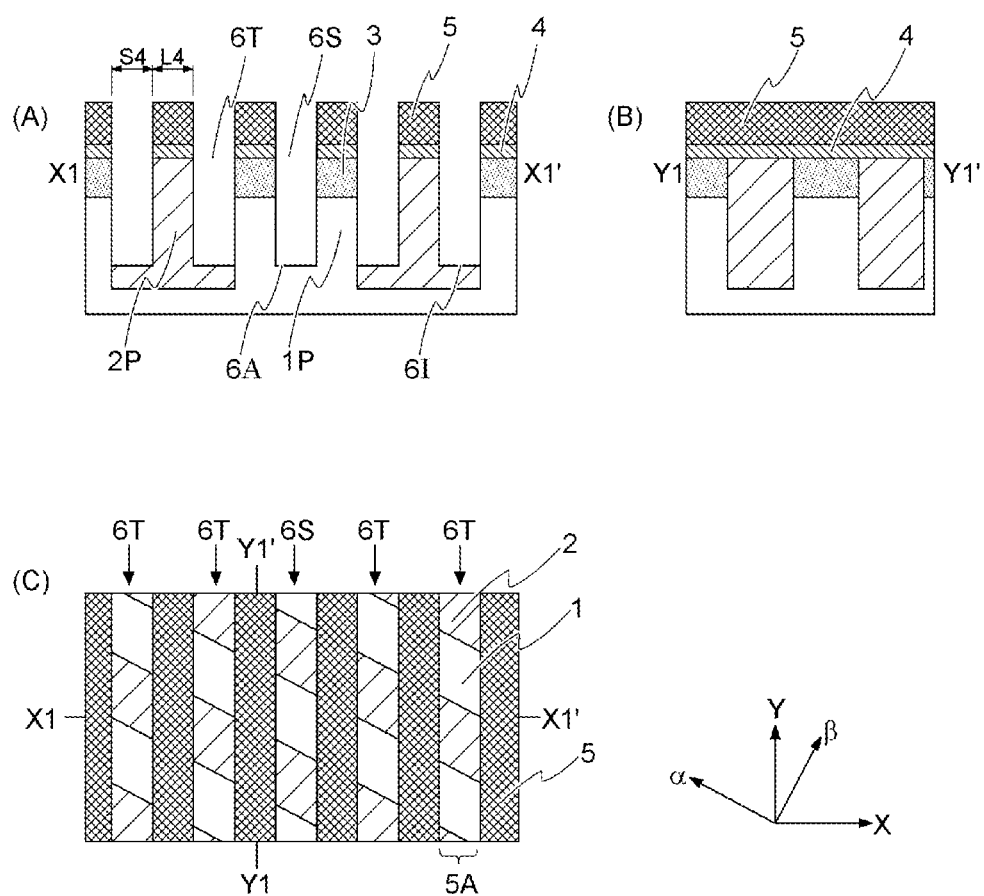
FIG. 11 is a drawing used to describe a step in the manufacture of a semiconductor device in one exemplary embodiment of the present invention, where (A) is a cross-sectional view through X1-X1' in (C), (B) is a cross-sectional view through Y1-Y1' in (C), and (C) is a top view.

[Step in FIG. 11]

An impurity is introduced into a surface region of the element-forming regions A, to form diffusion layers 3 serving as sources or drains of transistors. Phosphorus is used as the impurity, and this is introduced by ion implantation using an energy of 30 KeV and a dosage of $2\times10^{13}$ atoms/cm$^2$. The dosage and energy are adjusted in such a way that when the device is complete, the depth of the diffusion layer 3 is in a similar position to the position of the upper surface of the embedded gate electrode. A mask insulating film 4 is then formed on the substrate. A silicon dioxide film is used as the material, and the film thickness is 50 nm. Further, a first resist mask 5 is also formed, and first resist opening portions 5A, used to form gate trenches in the semiconductor substrate, are formed in said first resist mask 5. The first resist opening portion 5A patterns have a shape in which the opening width S4 in the X-direction is 40 nm, and in which the openings extend in the Y-direction, and said patterns are arranged in the X-direction with a pitch of 80 nm. The first resist masks 5, the width L4 of which is 40 nm and which extend in the Y-direction, are formed between the adjacent first resist opening portions. It should be noted that in this mode of embodiment 1, the minimum processing dimension F is 40 nm, and the first resist mask 5 is formed as a line-and-space pattern using the F value. The mask insulating film 4 is etched using the first resist masks 5. The semiconductor substrate 1 (diffusion layers 3) is exposed in the element-forming regions A, and the element isolating films 2 are exposed in the element isolation regions I.

The exposed semiconductor substrate 1 and element isolating films 2 are then etched to form trenches. The trenches are referred to as gate trenches 6. The gate trenches 6 are formed as a continuum from the semiconductor substrate 1 to the element isolating films 2. Gate trenches 6A formed in the element-forming regions A and gate trenches 61 formed in the element isolation regions I are formed in such a way as to have substantially the same depth, and are formed to a depth of 200 nm from the main obverse surface of the semiconductor substrate.

The element-forming regions A formed extending in the α-direction are separated in the X-direction by the gate trenches 6A, and are separated into pillar-shaped semiconductors, the planar shape of which is a parallelogram (referred to as semiconductor pillars 1P). Similarly, the element isolation regions I formed extending in the α-direction are separated in the X-direction by the gate trenches 61, and are separated into pillar-shaped element isolating films the planar shape of which is a parallelogram (referred to as insulator pillars 2P). The semiconductor pillars 1P and the insulator pillars 2P are formed alternately in the Y-direction, side by side in a row. Here, the gate trench in the center of FIG. 11 (C) as shown on the drawing sheet is referred to as a separating portion gate trench 6S, and the other two pairs of gate trenches are referred to as Tr portion gate trenches 6T.

Figure 12:
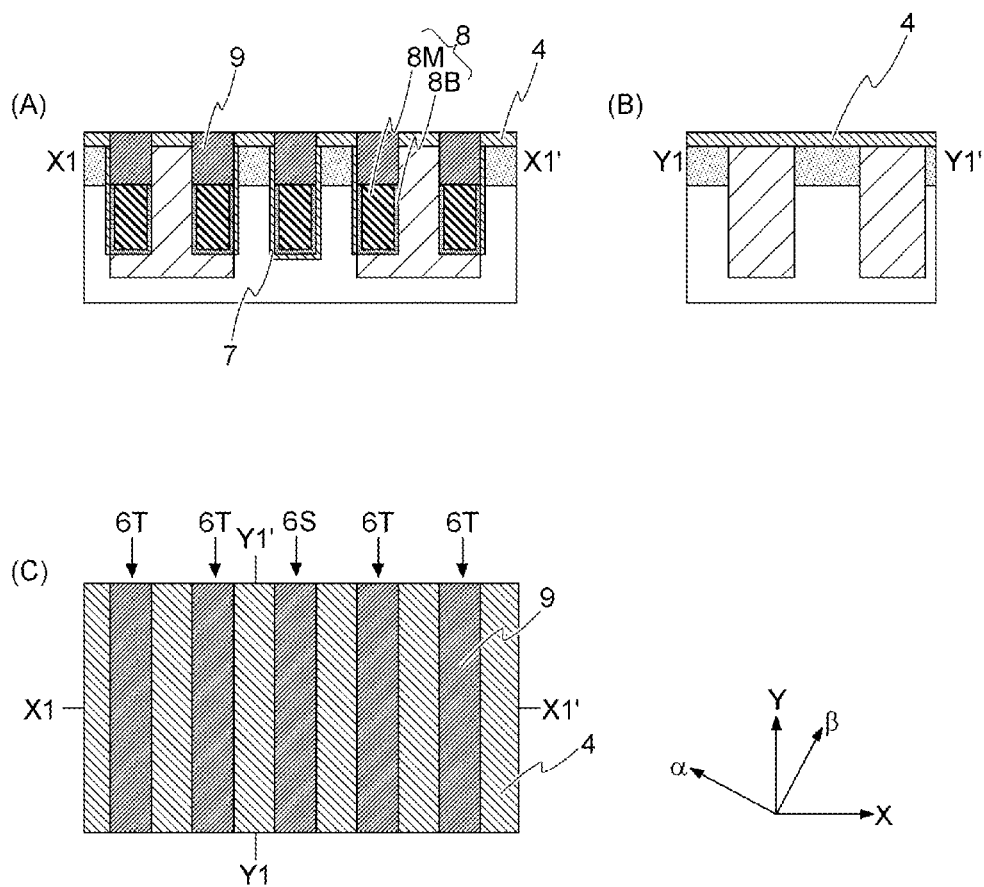
FIG. 12 is a drawing used to describe a step in the manufacture of a semiconductor device in one exemplary embodiment of the present invention, where (A) is a cross-sectional view through X1-X1' in (C), (B) is a cross-sectional view through Y1-Y1' in (C), and (C) is a top view.

[Step in FIG. 12]

The first resist masks 5 are removed. A gate insulating film 7 is formed on the surface of the semiconductor substrate exposed in the gate trenches 6. The gate insulating film 7 is a silicon dioxide film, formed to a thickness of 5 nm by thermal oxidation. It should be noted that there is no particular restriction to the material used for the gate insulating film 7, and a silicon oxynitride film or a high dielectric-constant film may also be used. Further, there is no particular restriction to the forming method, and CVD, ALD or the like may also be used.

A titanium nitride film, serving as a barrier layer, and a tungsten film, serving as a metal layer, are formed successively as gate electrode materials. The film thicknesses are 5 nm and 60 nm respectively. Here, the titanium nitride film is referred to as a gate titanium nitride film 8B, and the tungsten film is referred to as a gate tungsten film 8M. It should be noted that the gate electrode materials are not limited thereto, and a doped silicon film or other high-melting-point metal film, or a laminated film thereof, for example, may also be used.

The gate tungsten film 8M and the gate titanium nitride film 8B are successively etched back to form embedded gate electrodes 8. Etching-back is performed in such a way that the position of the upper surface of the gate tungsten film 8M and the position of the surface of the gate titanium nitride film 8B are recessed by substantially 100 nm from the main obverse surface of the semiconductor substrate. The embedded gate electrodes 8 are formed in such a way that the height thereof from the bottom portion of the gate trenches 6 is 100 nm.

A silicon nitride film is formed to a thickness of 50 nm in such a way as to fill the recessed parts formed in the gate trenches 6 above the embedded gate electrodes 8. The silicon nitride film is referred to as an embedded nitride film 9. The embedded nitride film 9 is then etched back to remove the embedded nitride film 9 on the mask insulating films 4, in such a way that the embedded nitride film 9 is embedded above the embedded gate electrodes 8 in the gate trenches 6. When seen in a plan view, the embedded nitride films 9, having a width of 40 nm, and the mask insulating films 4, having a width of 40 nm, are formed alternately in the X-direction. The embedded gate electrodes 8 in the Tr portion gate trenches 6T each form transistors, in combination with the adjacent diffusion layers 3. The embedded gate electrodes 8 in the separating portion gate trenches 6S are dummy gates for element isolation.

Figure 13:
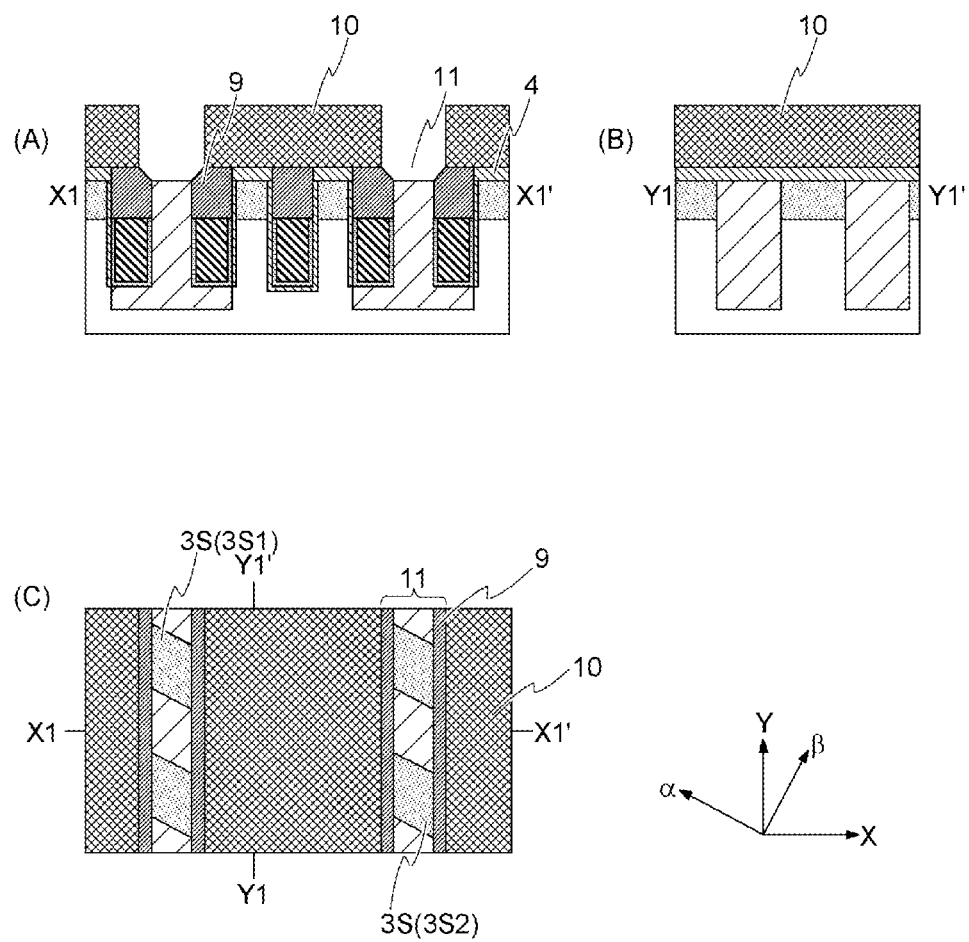
FIG. 13 is a drawing used to describe a step in the manufacture of a semiconductor device in one exemplary embodiment of the present invention, where (A) is a cross-sectional view through X1-X1' in (C), (B) is a cross-sectional view through Y1-Y1' in (C), and (C) is a top view.

[Step in FIG. 13]

The mask insulating film 4 is etched to form opening portions exposing the upper surfaces of source diffusion layers 3S (third diffusion regions) between the Tr portion gate trenches 6T and the upper surfaces of the element isolating films 2, which were below the mask insulating film 4. The opening portions are referred to as bit line contact opening portions 11. The etching is performed under conditions whereby the etching rate of the silicon nitride film and the etching rate of the silicon dioxide film are substantially the same, the mask insulating films 4 are etched, the embedded nitride films 9 revealed through openings in a second resist mask 10 are also removed by etching, and the etching is performed in such a way that the height of the upper surfaces of the etched embedded nitride films 9 is substantially the same as the height of the upper surfaces of the source diffusion layers 3S. Etching is preferably performed in such a way that the cross-sectional shape formed by the etching has a tapered shape, as illustrated in FIG. 13 (A). This is to prevent bit lines, formed in the next step, from breaking at the stepped portions, and also in order to suppress the generation of material remaining in the stepped portions after etching when the bit lines are patterned.

Figure 14:
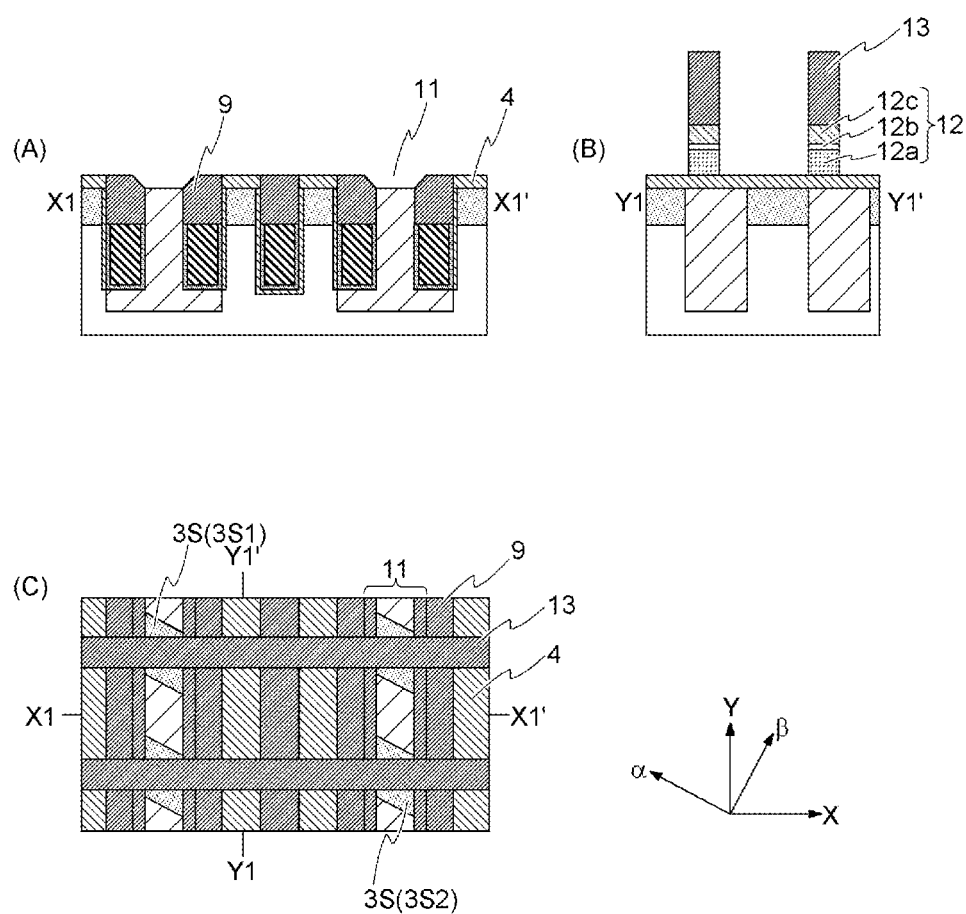
FIG. 14 is a drawing used to describe a step in the manufacture of a semiconductor device in one exemplary embodiment of the present invention, where (A) is a cross-sectional view through X1-X1' in (C), (B) is a cross-sectional view through Y1-Y1' in (C), and (C) is a top view.

[Step in FIG. 14]

After the second resist mask 10 has been removed, a polysilicon film, a tungsten nitride film and a tungsten film are formed successively as bit line 12 materials to thicknesses of 40 nm, 10 nm, and 40 nm respectively (referred to respectively as a bit line polysilicon film 12a, a bit line tungsten nitride film 12b and a bit line tungsten film 12c), and a hardmask comprising a silicon nitride film is formed to a thickness of 150 nm thereon (referred to as a bit line hardmask 13). In this way, the source diffusion layers 3 exposed in the bit line contact opening portions that have been opened are electrically connected to the bit line polysilicon film 12a. It should be noted that the thickness of the bit line hardmask 13 is suitably adjusted in such a way as to obtain a desired amount of offset between the positions of the centers of the upper surface and lower surface of a drain contact plug formed in a subsequent step.

The bit line tungsten film 12c, the bit line tungsten nitride film 12b and the bit line polysilicon film 12a are then sequentially etched, using the bit line hardmask 13 as a mask, to form bit lines 12.

Figure 15:
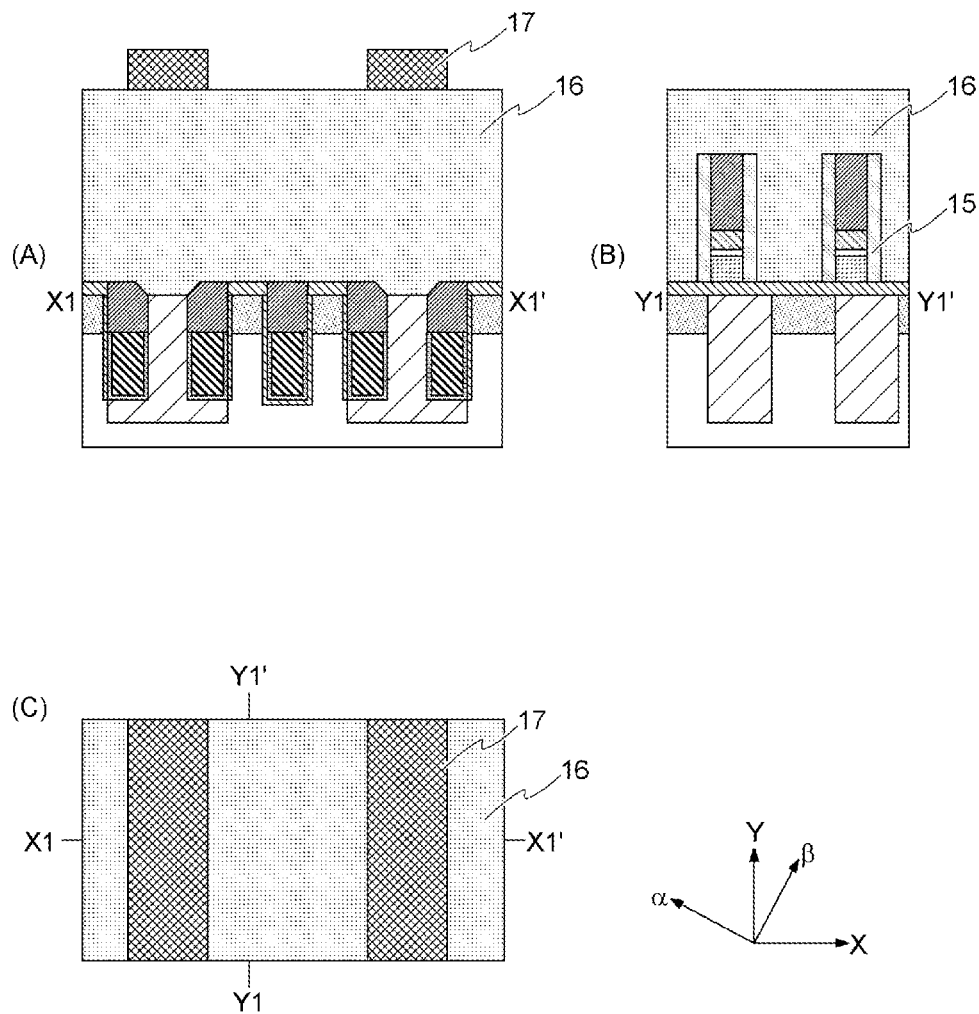
FIG. 15 is a drawing used to describe a step in the manufacture of a semiconductor device in one exemplary embodiment of the present invention, where (A) is a cross-sectional view through X1-X1' in (C), (B) is a cross-sectional view through Y1-Y1' in (C), and (C) is a top view.

[Step in FIG. 15]

A silicon nitride film is formed to a thickness of 10 nm, covering from the surface of the bit lines 12 to the substrate. The silicon nitride film is referred to as a first side wall film. The first side wall film is etched back to form first side walls 15 having a width of 10 nm, on the sidewalls of the bit lines.

A silicon dioxide film is then grown to a thickness of 300 nm in such a way as to fill between the bit lines. The silicon dioxide film is referred to as a first interlayer film 16. The first interlayer film is polished by CMP to planarize the surface. Polishing is performed in such a way that the first interlayer film 16 remains on the bit line hardmask 13 to a thickness of 100 nm. A resist mask is formed on the first interlayer film 16 in order to form drain contact holes 18 which penetrate through the first interlayer film 16 to expose the upper surfaces of the diffusion layers 3. The resist mask is formed as a line pattern extending in the Y-direction above the bit line contact opening portions 11. The resist mask is referred to as a third resist mask 17.

Figure 16:
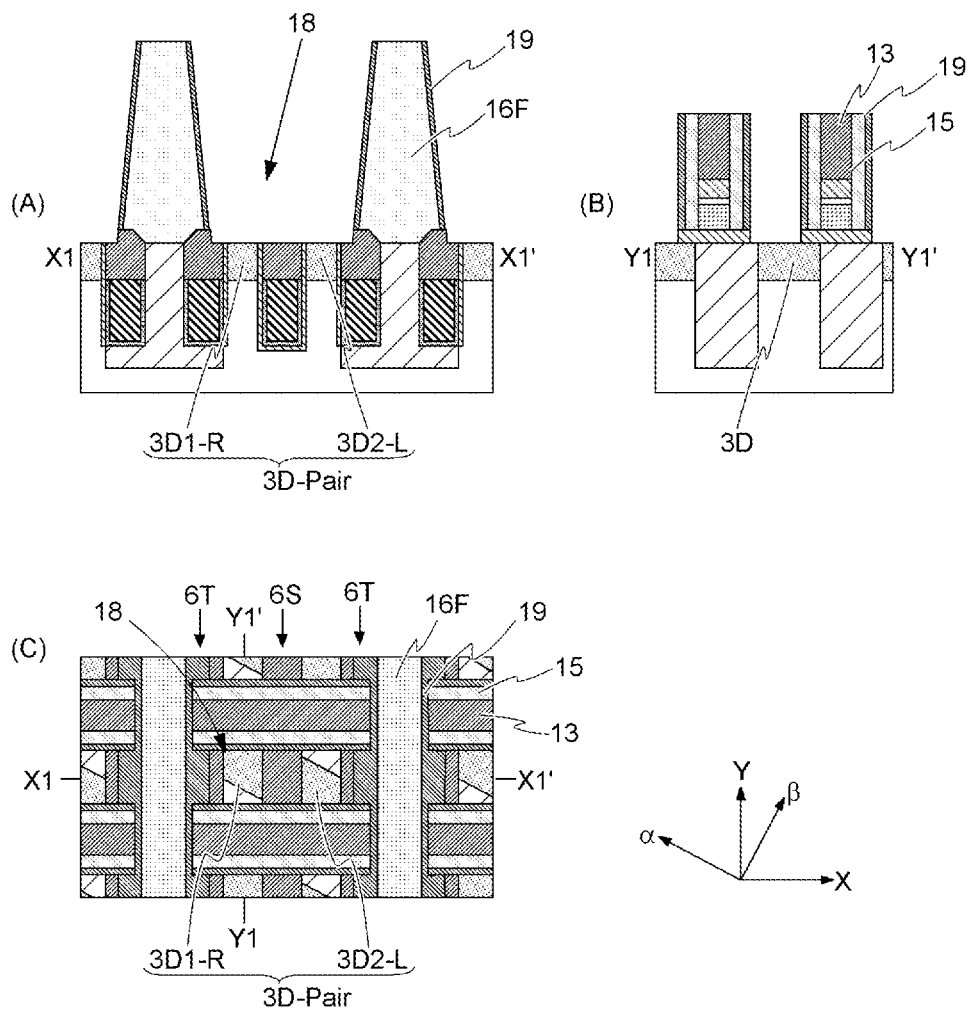
FIG. 16 is a drawing used to describe a step in the manufacture of a semiconductor device in one exemplary embodiment of the present invention, where (A) is a cross-sectional view through X1-X1' in (C), (B) is a cross-sectional view through Y1-Y1' in (C), and (C) is a top view.

[Step in FIG. 16]

Grooves (first grooves) extending in the Y-direction are formed in the first interlayer film 16 by etching using the third resist mask 17, to form opening portions in a self-aligned manner relative to the bit lines. The opening portions are referred to as drain contact holes 18. The etching is performed using conditions whereby the silicon nitride film is selectively etched, and is performed in such a way that the bit line hardmasks 13 on the upper surfaces of the bit lines 12, and the first side walls 15 on the sidewalls of the bit lines remain, and the bit lines 12 are not exposed. The upper surfaces of the mask insulating films 4 and the embedded nitride films 9 are exposed on the substrate.

Drain diffusion layers 3D are formed in regions which are demarcated to left and right, as seen in a plan view, by the Tr portion gate trenches 6T and the separating portion gate trench 6S, and which are demarcated above and below, as seen in a plan view, by the bit lines. The drain diffusion layers are formed in such a way as to be adjacent to one another in the X-direction, sandwiching the separating portion gate trench 6S. The pair of drain diffusion layers which are adjacent to one another are formed with point symmetry about a certain location on an X-direction centerline of the separating portion gate trench 6S. The two drain diffusion layers (for example 3D1-R (first diffusion region) and 3D2-L (second diffusion region)) formed adjacent to one another are referred to as an adjacent drain diffusion layer pair (3D-Pair). The adjacent drain diffusion layer pairs are disposed in a repeating manner in the Y-direction, with the same pitch. The separating portion gate trench 6S having a width F crosses the center of the adjacent drain diffusion layer pair in such a way as to extend in a straight line in the Y-direction, and the adjacent drain diffusion layer pair is separated by the separating portion gate trench 6S. The separating portion gate trench 6S is formed to a length F in the X-direction, and therefore the separation width between the adjacent drain diffusion layers is F.

The upper surfaces of the adjacent drain diffusion layer pair 3D-Pair formed as an adjacent pair are revealed by means of a single opening portion. The opening portion is formed using a method whereby it is opened in a self-aligned manner relative to the bit lines, in the Y-direction, said method being performed without demarcation in the Y-direction using a resist mask. The opening portions are opened in the X-direction by etching the parts revealed by the third resist mask 17. The opening portions in the third resist mask 17 are formed in such a way that the edges of the resist opening portions are positioned equidistant, in the X-direction, from the position of the center of the adjacent drain diffusion layer pair.

The opening portions are formed in such a way that the source diffusion layers 3S are not exposed at the ends, in the X-direction, of said opening portions. This is because if the source diffusion layers 3S are exposed, pad polysilicon films formed in the next step become electrically short-circuited to the source diffusion layers 3S. In this exemplary embodiment, the cross-sectional shape of the opening portions in the X-direction is formed in such a way that the cross-sectional shape of the first interlayer film 16 remaining below the third resist masks 17 is in the shape of a trapezoidal skirt, such that the width of the opening is smaller at the bottom than at the top. The first interlayer films 16 remaining below the third resist masks 17 are referred to as first interlayer film fins 16F. The first interlayer film fins 16F are formed extending over the bit lines 12, in the Y-direction, and in such a way that the X-direction cross section thereof is trapezoidal. The first interlayer film fins 16F in the parts above the bit lines have a height of 100 nm above the bit line hardmasks 13.

Here, by optimizing the first interlayer film 16 etching conditions, the taper angle can be adjusted as desired, up to approximately 45°. As a result, the opening portions are formed sandwiched by the bit lines 12 covered by the first side walls 15, in the Y-direction, and sandwiched by the first interlayer film fins 16F comprising silicon dioxide films, in the X-direction, and in the bottom portion of the opening portions are exposed the mask insulating films 4 above the adjacent drain diffusion layer pair 3D-Pair, the embedded nitride film 9 on the separating portion gate trench 6S, and the embedded nitride films 9 on the Tr portion gate trenches 6T.

A silicon nitride film is formed in the opening portions to a thickness of 5 nm in such a way as to cover the bit lines 12 and the first interlayer film fins 16F. The silicon nitride film is referred to as a second side wall film. The second side wall film is etched back to form second side walls 19 on the sidewalls of the first side walls 15 of the bit lines 12, and on the sidewalls of the first interlayer film fins 16F, and the mask insulating film 4 is removed to expose the upper surfaces of the adjacent drain diffusion layer pair 3D-pair. Further, at this time, portions of the embedded nitride films 9 are also removed. It should be noted that it is also possible for the mask insulating film 4 to be removed to expose the upper surfaces of the adjacent drain diffusion layer pair 3D-pair when the first interlayer film 16 is etched, before the second side wall film is deposited.

The second side walls 19 are formed in order to prevent the first interlayer film fins 16F from being etched, causing a reduction in the film thickness, when a cleaning process is performed in the next step in which pad polysilicon filler bodies are formed. It should be noted that if a reduction in the thickness of the first interlayer film fins 16F as a result of the cleaning process is not a problem, then the second side walls 19 do not need to be formed.

By means of this step, first space portions 18 are formed, sandwiched, in the Y-direction, between the bit lines 12 covered by silicon nitride films (the second side walls 19), and sandwiched, in the X-direction, between the first interlayer film fins 16F comprising silicon dioxide films. The upper surfaces of the adjacent drain diffusion layer pair 3D-pair, the upper surface of the element isolating film 2, the embedded nitride film 9 on the separating portion gate trench, and the embedded nitride films 9 on the Tr portion gate trenches are exposed in the bottom portion of the first space portion 18, and therefore the first space portion 18 is referred to as a drain contact hole 18 in the following description. One adjacent drain diffusion layer pair is formed in the bottom portion of each drain contact hole 18. The upper surfaces of the drain diffusion layer 3D1-R and the drain diffusion layer 3D2-L forming the adjacent drain diffusion layer pair are exposed in a central portion of FIG. 16 (C). The bottom portion of the drain contact hole 18 is formed in the shape of a rectangle having a width of approximately 50 nm in the Y-direction and a width of approximately 150 nm in the X-direction.

Figure 17:
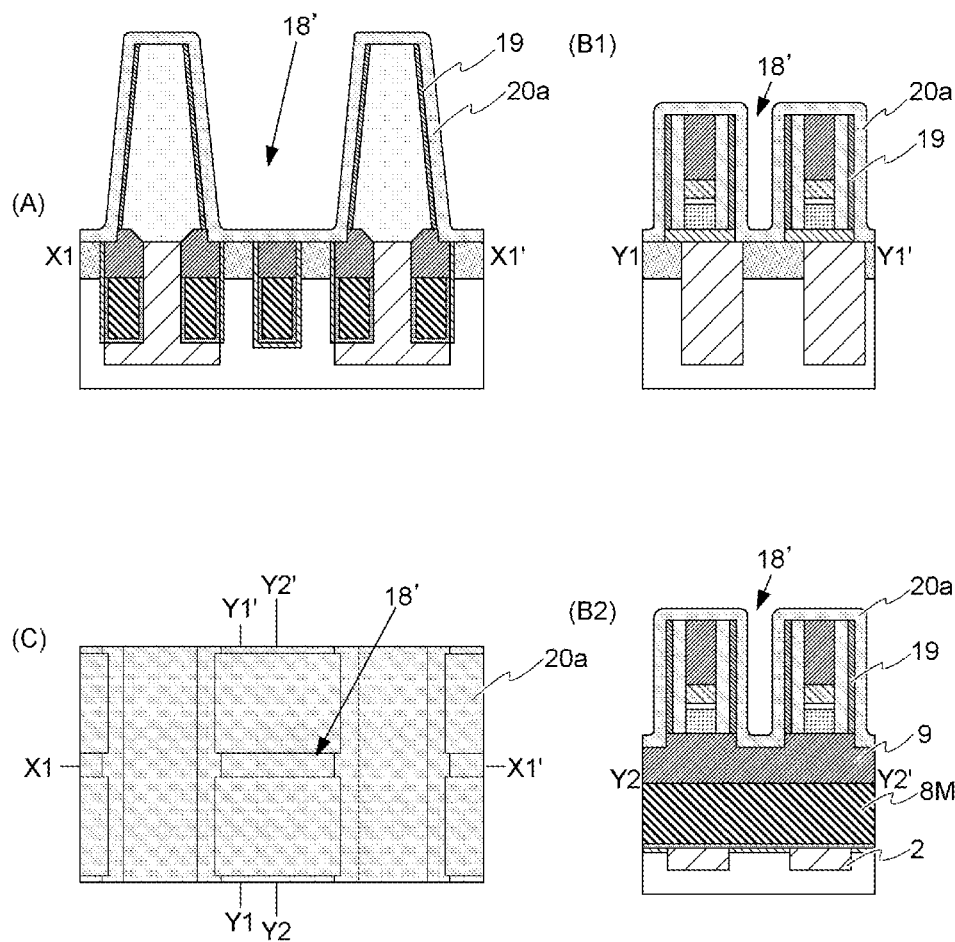
FIG. 17 is a drawing used to describe a step in the manufacture of a semiconductor device in one exemplary embodiment of the present invention, where (A) is a cross-sectional view through X1-X1' in (C), (B1) is a cross-sectional view through Y1-Y1' in (C), (B2) is a cross-sectional view through Y2-Y2' in (C), and (C) is a top view.

[Step in FIG. 17]

After a cleaning process has been performed to remove etching residue on the substrate, a first silicon film (underlying layer) 20 containing a high concentration of P (phosphorus) as an impurity is formed on the inner walls of the drain contact hole 18 to a thickness that does not fill the contact hole 18, for example a thickness of 10 nm. The concentration of the impurity contained in the first silicon film 20a is 7E20 to 1.5E21 (atoms/cm$^3$), for example. The first silicon film 20a can be formed using DOPOS (Doped polysilicon), or by forming a non-doped polysilicon film and then injecting an impurity. The first silicon film 20a may also be doped amorphous silicon. The drain contact hole 18 after the first silicon film 20a has been formed is described as a second space portion 1W. The bottom portion of the second space portion 1W is formed substantially in the shape of a rectangle having a width of approximately 30 nm in the Y-direction and a width of approximately 130 nm in the X-direction.

Figure 18:
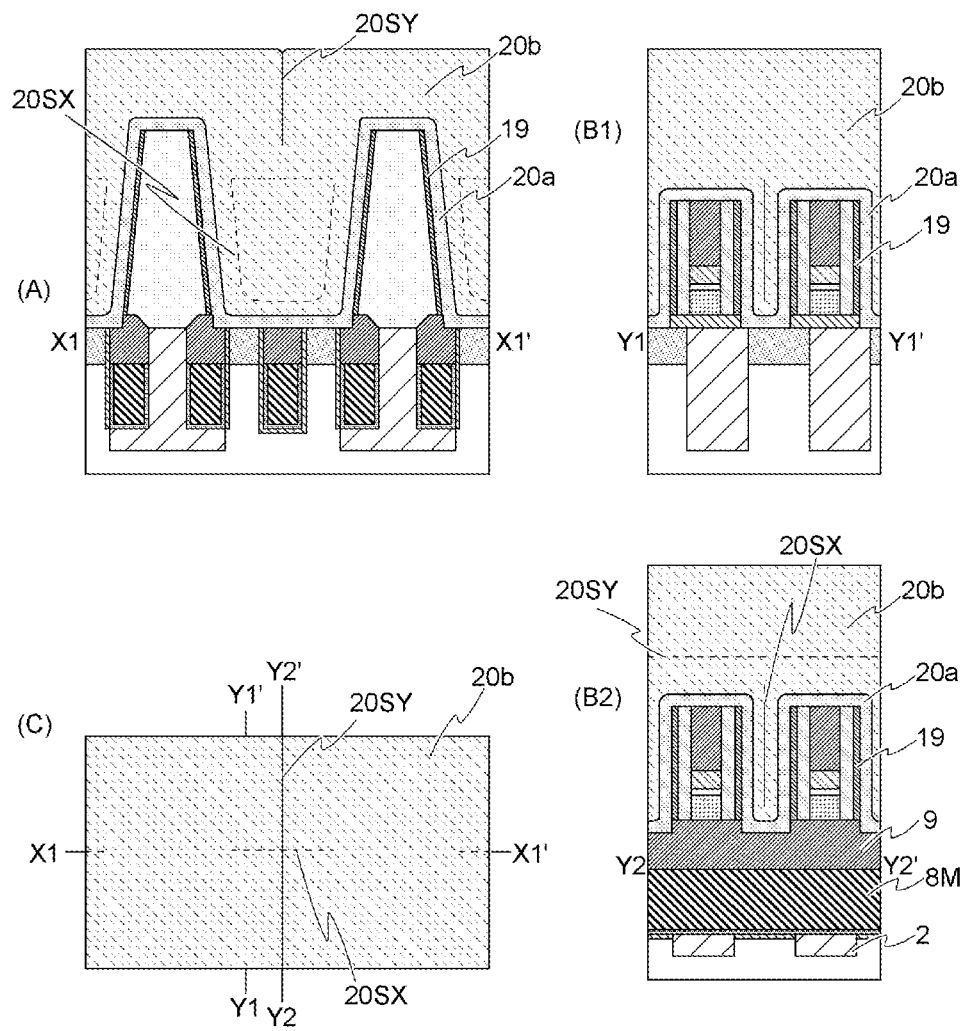
FIG. 18 is a drawing used to describe a step in the manufacture of a semiconductor device in one exemplary embodiment of the present invention, where (A) is a cross-sectional view through X1-X1' in (C), (B1) is a cross-sectional view through Y1-Y1' in (C), (B2) is a cross-sectional view through Y2-Y2' in (C), and (C) is a top view.

[Step in FIG. 18]

Next, the second space portion 18' is filled by a second silicon film (embedded layer) 20b having a lower impurity concentration than the first silicon film 20a. Here, the second silicon film 20b is deposited until it reaches a thickness of 100 nm above the first silicon film 20a on the upper surface of the first interlayer film fin 16F. The concentration of the impurity contained in the second silicon film 20b is lower than that in the first silicon film 20a, for example 4E20 to 5E20 (atoms/cm$^3$). By means of this step, a laminated structure comprising the first silicon film 20a and the second silicon film 20b is formed on the upper surfaces of the drain contact holes 3D exposed in the bottom portion of the drain contact hole 18. Joints (seams) 20SX and 20SY form in the second silicon film 20b during deposition.

Figure 19:
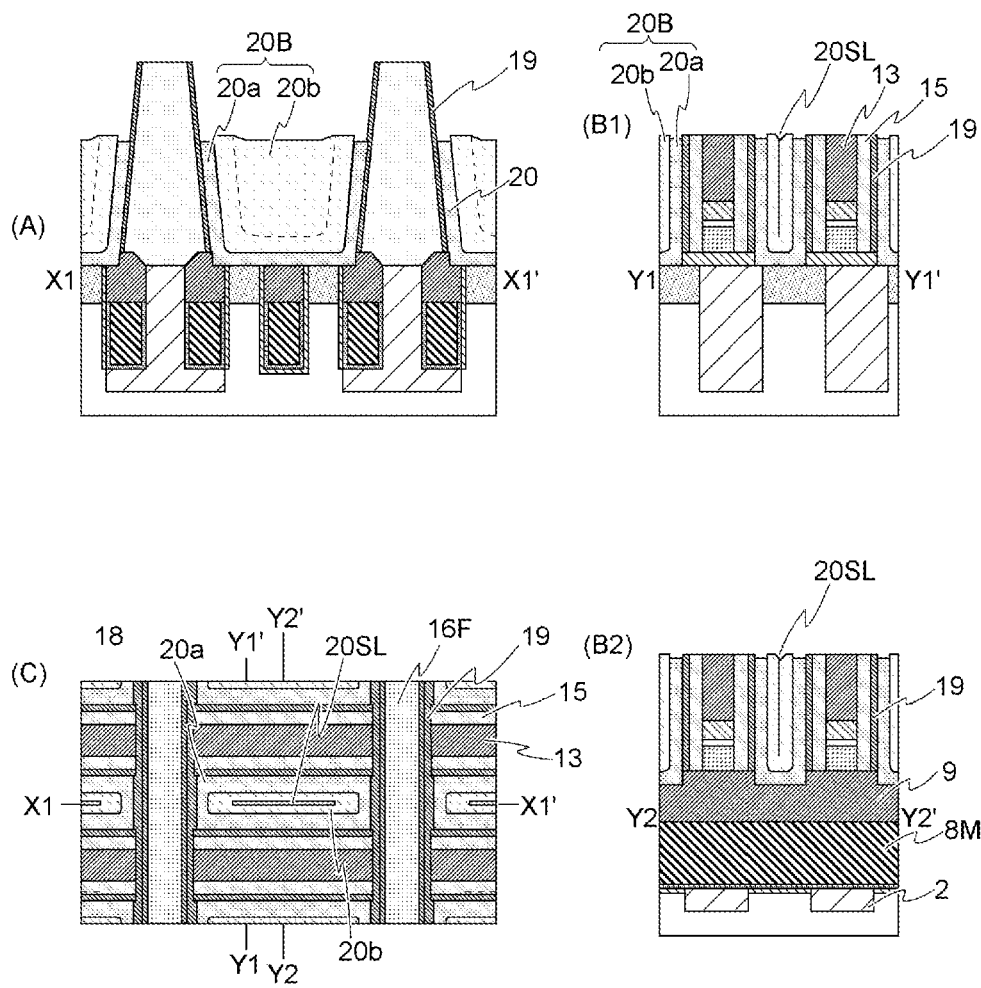
FIG. 19 is a drawing used to describe a step in the manufacture of a semiconductor device in one exemplary embodiment of the present invention, where (A) is a cross-sectional view through X1-X1' in (C), (B1) is a cross-sectional view through Y1-Y1' in (C), (B2) is a cross-sectional view through Y2-Y2' in (C), and (C) is a top view.

[Step in FIG. 19]

The first silicon film 20a and the second silicon film 20b are etched back in such a way as to expose the upper surfaces of the bit line hardmasks in the upper portions of the bit lines, and the first silicon film 20a and the second silicon film 20b fill a region demarcated by the first interlayer film fins 16F and the bit lines 12. Etching back is implemented using hydrogen bromide (HBr) 100 sccm, chlorine (Cl$_2$) 100 sccm, and oxygen (O$_2$) 10 sccm as the etching gas, in a plasma atmosphere, under the following conditions, for example: a pressure of 0.5 Pa, a high-frequency power of 500 W, and a bias power of 150 W. The embedded first silicon film 20a and second silicon film 20b are referred to as a silicon filler body 20B. Silicon filler bodies 20B are formed in each drain contact hole 18, and the silicon filler bodies 20B are electrically isolated from one another between adjacent drain contact holes 18. Further, the entire seam 20SY that was formed in the upper portion of the second silicon film 20b is removed, and the seam 20SX which was embedded is exposed.

The seam 20SX which formed when the second silicon film 20b was deposited becomes larger as a result of the etching back, and appears as a slit 20SL in the upper surface of the silicon filler body 20B. Further, the first silicon film 20a forming the silicon filler body 20B contains a high concentration of impurity, and the second silicon film 20b contains a medium concentration of impurity, and therefore the first silicon film 20a is etched with a higher etching rate than the second silicon film 20b. As a result, a recessed part is formed in the upper surface of the first silicon film 20a in the silicon filler body 20B.

A 100 nm part, approximately, of the upper portions of the first interlayer film fins 16F projects out at the upper surface of the substrate, and the projecting first interlayer film fins 16F are formed extending in the Y-direction. It should be noted that the configuration is such that, at this time, the side surfaces of the second side walls 19 on the side surfaces of the bit line hardmasks 13 are not significantly exposed. If the exposed amount is large, then in some cases third side wall films 21 formed in the next step remain at the sides of the bit line hardmasks 13, resulting in incomplete division of the silicon filler body 20B.

Figure 20:
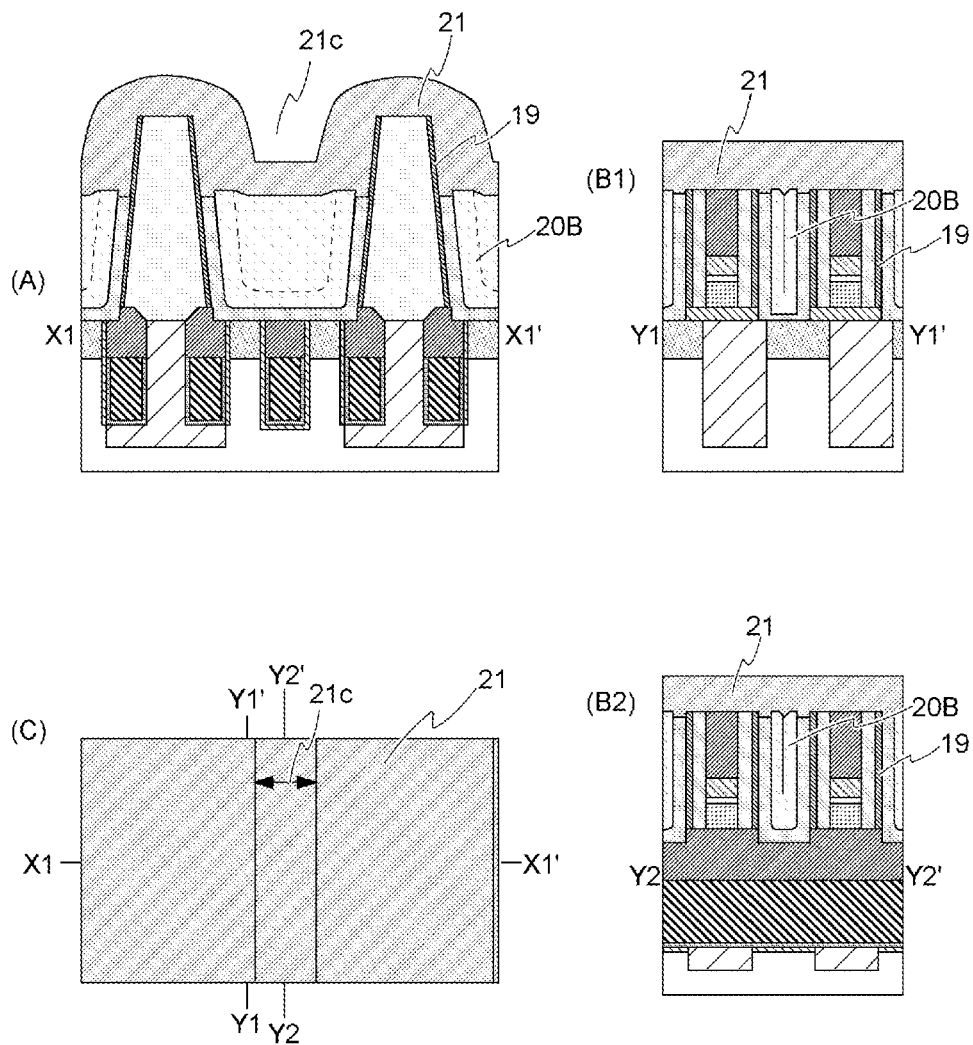
FIG. 20 is a drawing used to describe a step in the manufacture of a semiconductor device in one exemplary embodiment of the present invention, where (A) is a cross-sectional view through X1-X1' in (C), (B1) is a cross-sectional view through Y1-Y1' in (C), (B2) is a cross-sectional view through Y2-Y2' in (C), and (C) is a top view.

[Step in FIG. 20]

A silicon dioxide film is formed to a thickness of 60 nm in such a way as to cover from the exposed side surfaces and upper surfaces of the first interlayer film fins 16F having a height of approximately 100 nm, to the bit lines 12 and the silicon filler body 20B. The silicon dioxide film is referred to as a third side wall film 21. The third side wall film 21 is formed to a thickness that forms a recessed portion 21C between the first interlayer film fins 16F that are adjacent to one another in the X-direction. It should be noted that the thickness of the third side wall film 21 is adjusted in accordance with the opening width of a silicon groove 20T to be formed in the step in FIG. 21.

Figure 21:
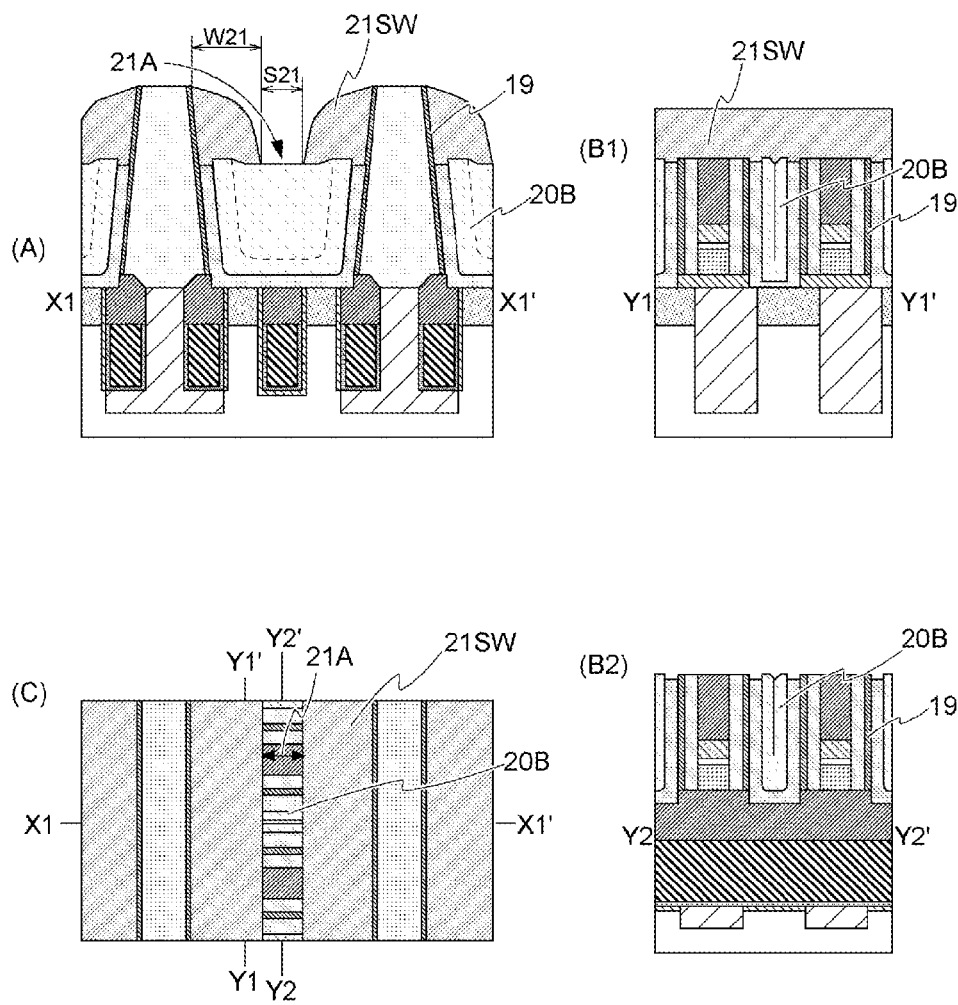
FIG. 21 is a drawing used to describe a step in the manufacture of a semiconductor device in one exemplary embodiment of the present invention, where (A) is a cross-sectional view through X1-X1' in (C), (B1) is a cross-sectional view through Y1-Y1' in (C), (B2) is a cross-sectional view through Y2-Y2' in (C), and (C) is a top view.

[Step in FIG. 21]

The third side wall film 21 is etched back to form third side walls 21SW on the sidewalls of the first interlayer film fin 16F. The third side walls 21SW are formed with a width W21, in the X-direction, of 60 nm. A part of the upper surface of the silicon filler body 20B, sandwiched by the third side walls 21SW, is exposed to an opening width S21 in the X-direction of 40 nm. This opening portion is referred to as a third side wall opening portion 21A. The third side wall opening portion 21A is opened extending in the Y-direction, and the upper surface of the silicon filler body 20B, and the slit 20SL and the bit line hardmasks 13 above the bit lines 12 are exposed in the opening portion. The silicon filler body 20B is formed from the first silicon films 20a which are in contact with the side walls 19 formed on the side walls of the bit lines, and the second silicon film 20b which is in contact with the first silicon films 20a. Therefore the upper surface of the silicon filler body 20B is formed from the upper surfaces of the two first silicon films 20a that oppose one another in the Y-direction and are in contact with the second side walls 19 covering the side surfaces of the bit lines extending in the second direction (X-direction), adjacent to one another in the first direction (Y-direction), and the upper surface of the second silicon film 20b located between the two first silicon films 20a which face one another in the Y-direction.

[Step in FIG. 22]

Using the third side walls 21SW, the first interlayer film fins 16F and the bit line hardmasks 13 as a mask, the silicon filler body 20B exposed in the third side wall opening portion 21A is dry etched under anisotropic conditions, to form a groove portion in the silicon filler body 20B. This etching is implemented using hydrogen bromide (HBr) 100 sccm, chlorine ($Cl_2$) 100 sccm, and oxygen ($O_2$) 10 sccm as the etching gas, in a plasma atmosphere, under the following conditions, for example: a pressure of 0.5 Pa, a high-frequency power of 500 W, and a bias power of 150 W. The groove portion formed in the silicon filler body 20B as described hereinabove is referred to as a silicon groove 20T. The silicon filler body 20B is separated to left and right, in the X-direction, into two parts by the silicon groove 20T. Each of the separated parts of the silicon filler body is called a drain contact plug 22. In the third side wall opening portion 21A, because the etching rate of the second silicon films 20b is slow, the slit 20SL located in the center between the adjacent bit lines does not widen greatly, and said slit 20SL remains within the silicon groove 20T, and is not generated significantly in the drain contact plugs 22. As a result, when the central portion of the silicon filler body 20B that is not covered by the third side walls 21SW has been removed, the seam 20SX therebelow is also removed, and there is only a slight reduction in the surface area of the plugs after etching, and thus high-resistance defects resulting from an increase in the drain contact resistance can be prevented. It should be noted that the second silicon films 20b contain a medium concentration of impurity, but by performing an annealing process or the like in a step after FIG. 22, the impurity in the first silicon films 20a diffuses into the second silicon films 20b, and the contact resistance is thus reduced further. The annealing process or the like may be provided as an independent step for diffusion of the impurity into the second silicon films 20b, or may be performed simultaneously with heat treatment in another step in the manufacture of the semiconductor device.

By means of this step, the two drain contact plugs 22, separated to left and right in a central part in the X-direction, are formed in the drain contact hole 18, and one drain contact plug 22 is connected to one drain diffusion layer 3D. The separated silicon filler body 20B thus becomes the contact plugs 22 which are connected to the drain diffusion layers 3D. The contact plug 22 connected to the drain diffusion layer 3D1-R is referred to as a first contact plug 22A, and the contact plug 22 connected to the drain diffusion layer 3D2-L is referred to as a second contact plug 22B. In this way, the two contact plugs (twin plugs), namely the first contact plug 22A and the second contact plug 22B, are formed in the single drain contact hole 18.

Figure 23:
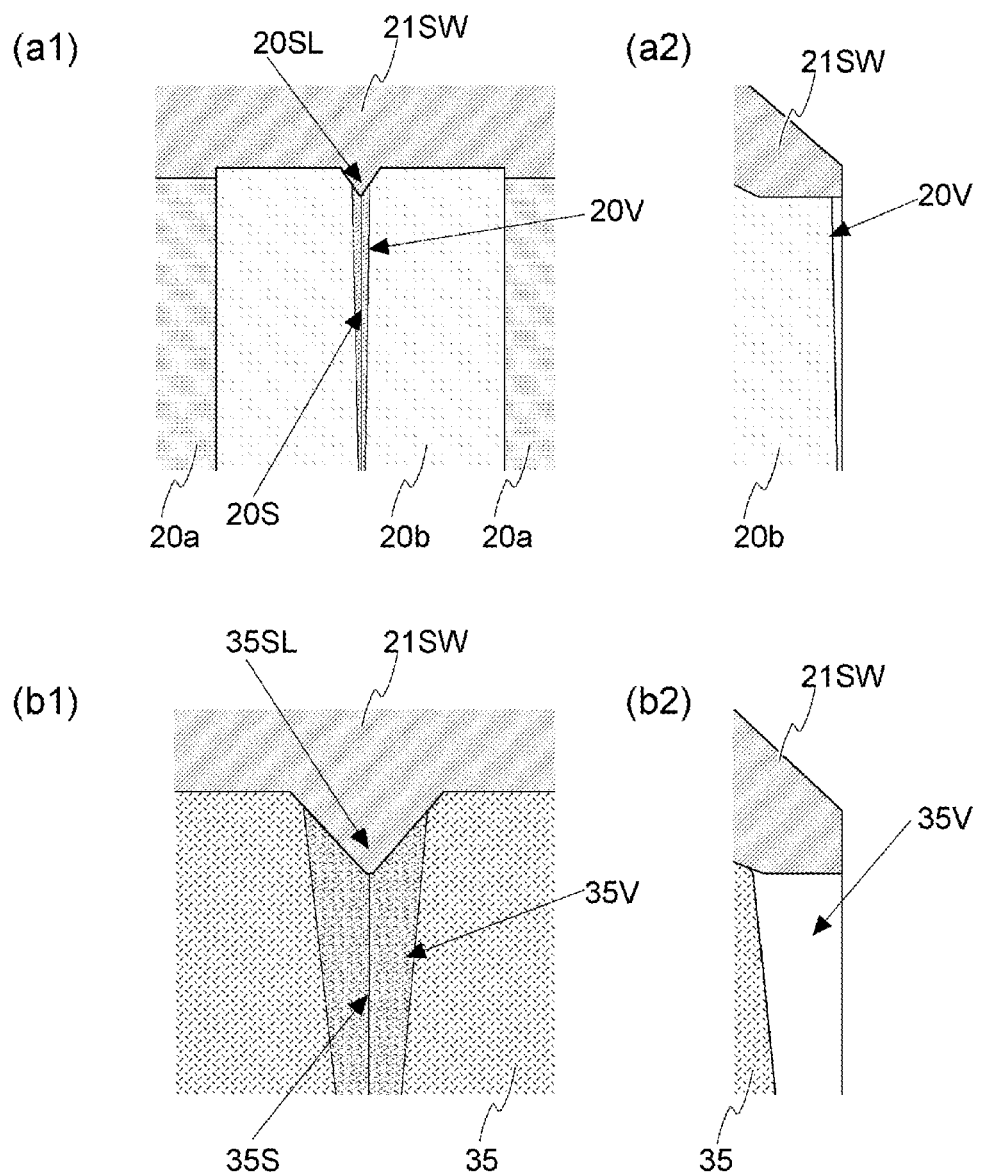
FIG. 23 (a1) is an enlarged view of a dividing surface in a silicon filler body 20B as seen from the direction indicated by Q in FIG. 22 (A), (a2) is a side elevation thereof, (b1) is an enlarged view of a comparative example of a dividing surface in a conventional example in which doped polysilicon 35 is embedded, and (b2) is a side elevation thereof.

Here, FIG. 23 (a1) is an enlarged view illustrating the dividing surface of the silicon filler body 20B as seen from the direction of the arrow Q in FIG. 22 (A), and FIG. 23 (a2) is a side elevation thereof. Further, as a comparative example, FIGS. 23 (b1) and (b2) are an enlarged view and a side elevation illustrating the dividing surface in a case in which conventional doped polysilicon 35 (having the second concentration) is embedded in the drain contact hole 18 in one step and is divided in the same way. In some cases, side etching penetrates slightly along the exposed seam 20SX, and a small void 20V is formed in the dividing surface. In the case of the conventional doped polysilicon 35, a long, large slit 35SL is formed during etch-back prior to the formation of the third side wall films 21, and side etching progresses further along the seam 35S when the silicon filler body 20B is divided, and in some cases a large void 35V forms. An isolating and insulating film then penetrates into the void 35V in the next step, thus reducing the contact surface area. In the present invention, even if a small void 20V forms, only a small amount of the isolating and insulating film penetrates thereinto, and the reduction in the contact surface area is very small. It should be noted that the dividing surface of the first silicon film 20a is more susceptible to side etching than the dividing surface of the second silicon film 20b, but because it does not recede greatly, as is the case with the seam 35S in the doped polysilicon 35, there is little impact on the contact surface area. Further, the joining surface between the first silicon film 20a and the second silicon film 20b is formed without a void, and therefore side etching does not progress at the joining surface.

In the present invention, by adjusting the thickness of the third side wall films 21, the silicon groove 20T can be formed to a width smaller than the photolithography minimum processing dimension F, and it is thus possible for the contact plugs 22 formed adjacent to one another to be formed with a separation width that is less than the F value.

In a DRAM memory cell layout, each component part is formed using dimensions that are in the vicinity of the photolithography minimum processing dimension F. In this exemplary embodiment, the drain diffusion layers that are adjacent to one another in the X-direction are also formed with a separate width of 1F. When forming a contact connected to such a drain diffusion layer, conventionally one resist mask opening portion in the shape of a hole is formed on one drain diffusion layer, a contact hole is opened by etching, using the resist mask as a mask, and a contact is formed.

However, it is difficult for contact holes formed adjacent to one another to be formed with a separation width that is scaled down to the F value or less, and adjacent contact holes are therefore formed with a separation width of 1F. Thus if alignment displacement occurs, this leads to a reduction in the contact surface area between the contact and the drain diffusion layer. Further, when an opening is formed by conventional etching, the contact hole is liable to be formed in the shape of a taper, and therefore the diameter of the bottom of the contact hole is liable to decrease, leading to a further reduction in the contact surface area.

In the present invention, the contact plugs connected respectively to the two adjacent diffusion layers can be formed with a separation width that is scaled down to the F value or less, and thus the contact surface area between the diffusion layer and the contact plug can be adequately maintained, and the contact resistance can be reduced. Further, the silicon filler body 20B is formed from two layers, and during etching to separate the silicon filler body 20B, the conditions are set such that the lower layer first silicon film 20a has a higher etching rate than the upper layer second silicon film 20b. Thus the first silicon film 20a and the second silicon film 20b are removed effectively by the etching, and it is possible to prevent etching residue being generated in the bottom portion of the drain contact hole 18, causing short-circuiting between the first and second contact plugs after etching.

Further, in the present invention, forming can be effected without the addition of a new photolithography step, and the device can therefore be produced inexpensively.

Further, the contact hole opening pattern has an opening width that is at least equal to a size corresponding to the size of two contact holes formed in the prior art, and therefore the opening pitch can be relaxed, widening the exposure resolution margin, and improving the manufacturing yield. In other words, an exposure technique having a moderate resolution can be used, and this has the advantage that manufacturing costs can be suppressed.

[Step in FIG. 24]

A silicon nitride film is formed to a thickness of 50 nm in such a way as to fill the silicon groove 20T. The silicon nitride film is referred to as an isolating and insulating film 23. When the isolating and insulating film 23 is formed, because almost no voids are generated in the drain contact plugs 22, there is no penetration of the isolating and insulating film 23, and there is no reduction in the plug surface area, and it is therefore possible to prevent high-resistance defects resulting from an increase in the drain contact plug resistance.

[Step in FIG. 25]

The isolating and insulating film 23 is planarized by polishing using CMP. The silicon nitride films (the isolating and insulating film 23, the second side walls 19, the first side walls 15, and the bit line hardmasks 13), and the silicon dioxide films (the third side walls 21SW and the first interlayer film fins 16F) are etched back using the same etching rate, to expose the surfaces of the drain contact plugs 22.

Figure 26:
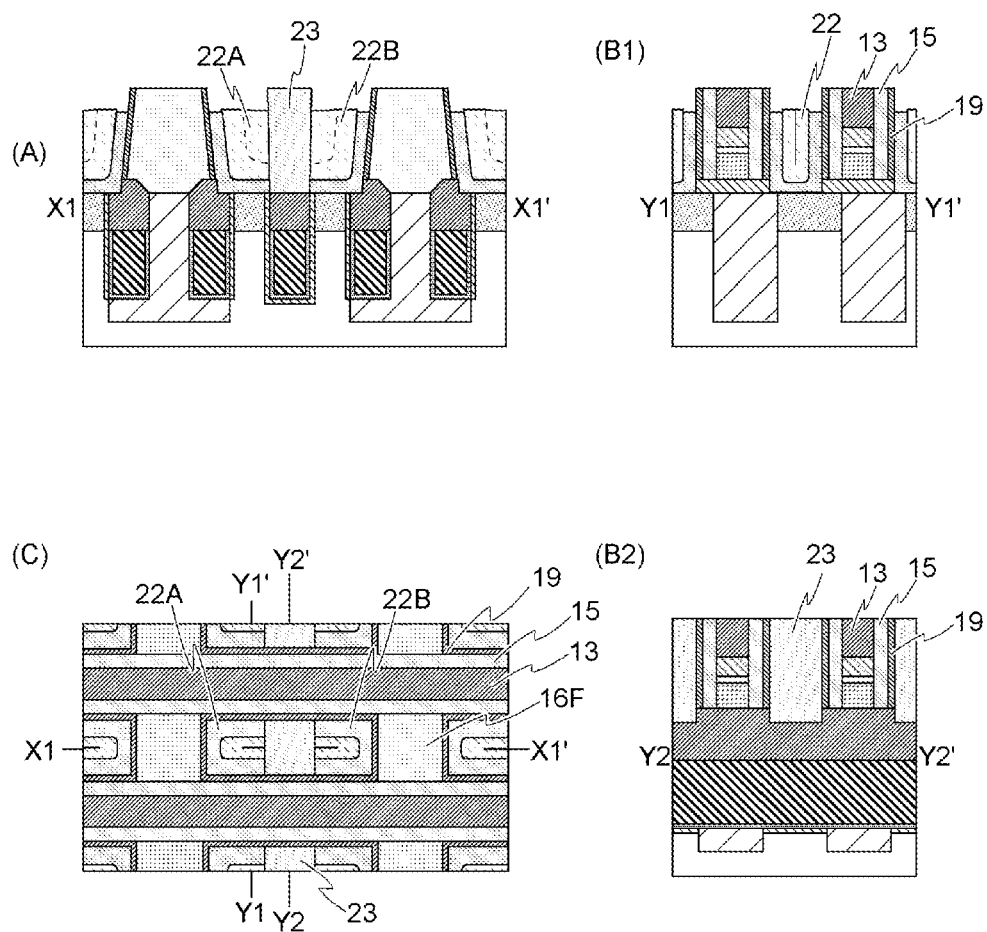
FIG. 26 is a drawing used to describe a step in the manufacture of a semiconductor device in one exemplary embodiment of the present invention, where (A) is a cross-sectional view through X1-X1' in (C), (B1) is a cross-sectional view through Y1-Y1' in (C), (B2) is a cross-sectional view through Y2-Y2' in (C), and (C) is a top view.

[Step in FIG. 26]

The surfaces of the exposed drain contact plugs 22 are etched back to form recesses for contact pads. The etched state illustrated here is one in which heat treatment has still not been performed, illustrating a state in which the first silicon films 20a have been etched more deeply than the second silicon films 20b, but a difference in level such as that illustrated in the drawing does not form if heat treatment is implemented prior to this step, causing impurities to diffuse from the first silicon films 20a to the second silicon films 20b and homogenizing the first and second silicon films.

Figure 27:
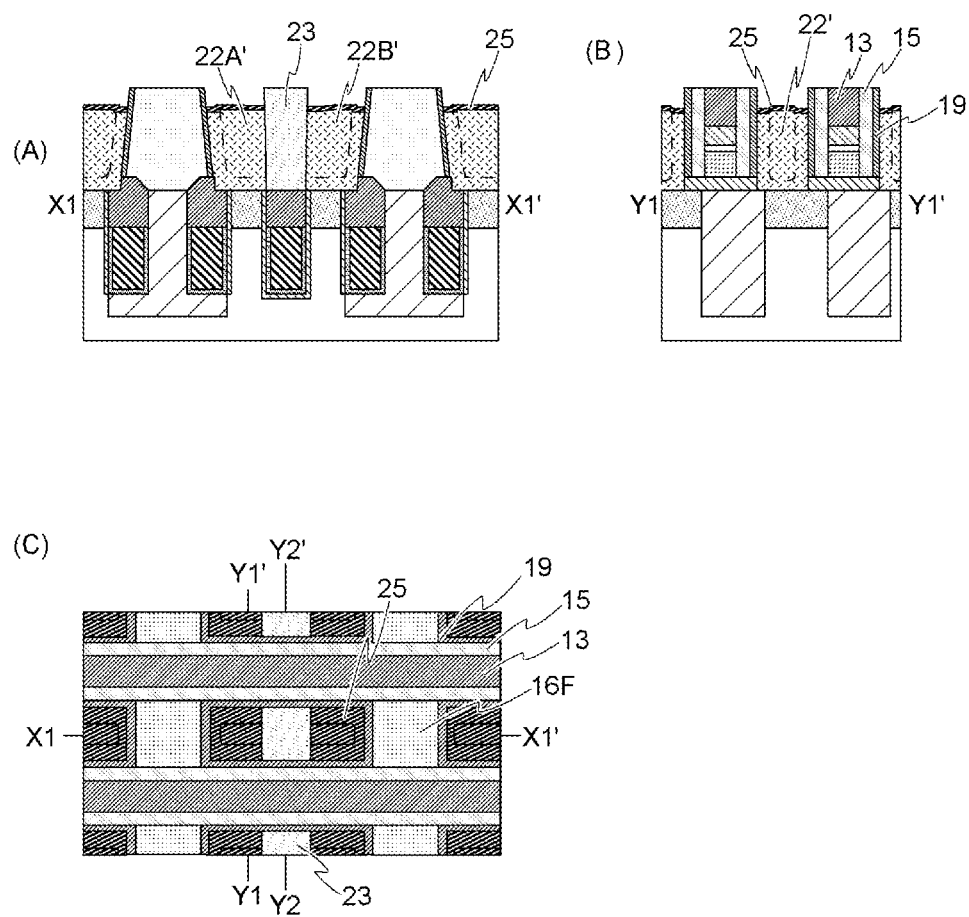
FIG. 27 is a drawing used to describe a step in the manufacture of a semiconductor device in one exemplary embodiment of the present invention, where (A) is a cross-sectional view through X1-X1' in (C), (B) is a cross-sectional view through Y1-Y1' in (C), and (C) is a top view.

[Step in FIG. 27]

A silicide film 25 is formed on the drain contact plugs 22 in the drain contact hole 18. The silicide film 25 is cobalt silicide ($CoSi_2$), formed by depositing a cobalt film over the entire surface and then performing heat treatment to cause the drain contact plugs 22 and the cobalt to react. By means of this heat treatment, impurities are diffused from the first silicon film 20a to the second silicon film 20b. The contact plugs after impurity diffusion are referred to as 22' (first contact plug 22A' and second contact plug 22W). The unreacted cobalt film on the insulating film is removed by wet etching using acid.

Figure 28:
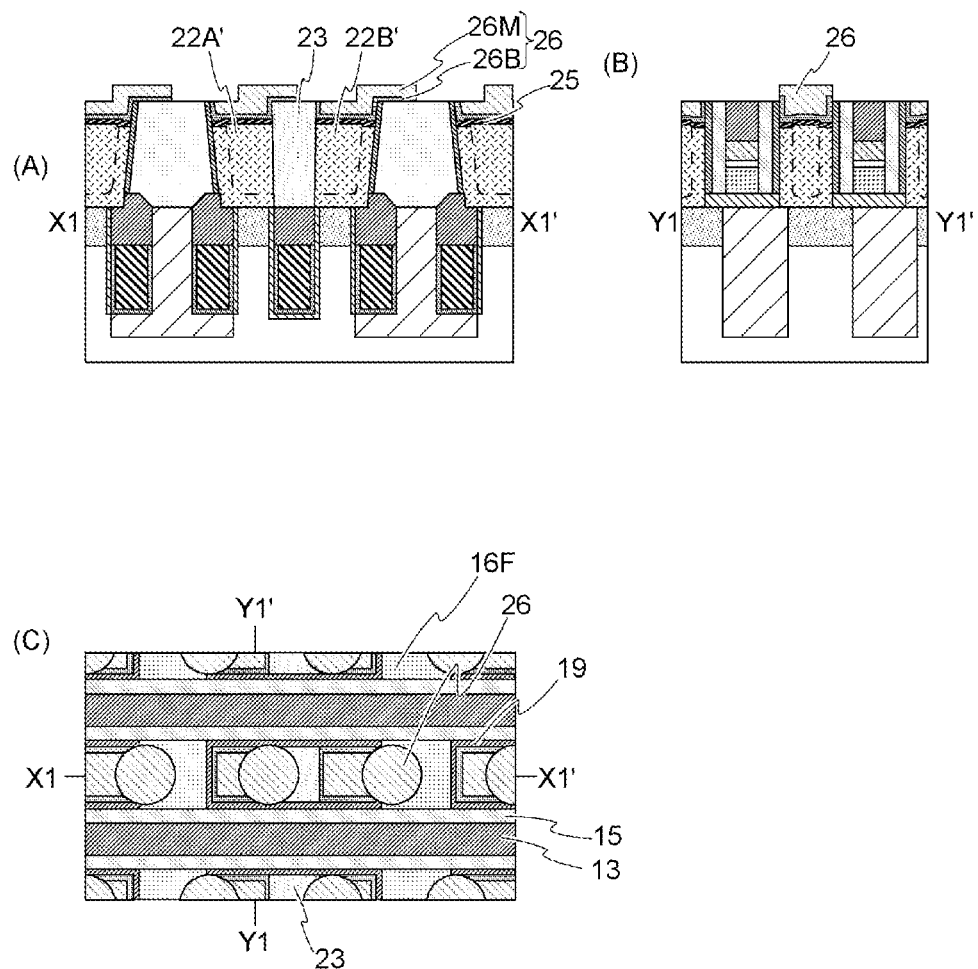
FIG. 28 is a drawing used to describe a step in the manufacture of a semiconductor device in one exemplary embodiment of the present invention, where (A) is a cross-sectional view through X1-X1' in (C), (B) is a cross-sectional view through Y1-Y1' in (C), and (C) is a top view.
Figure 29:
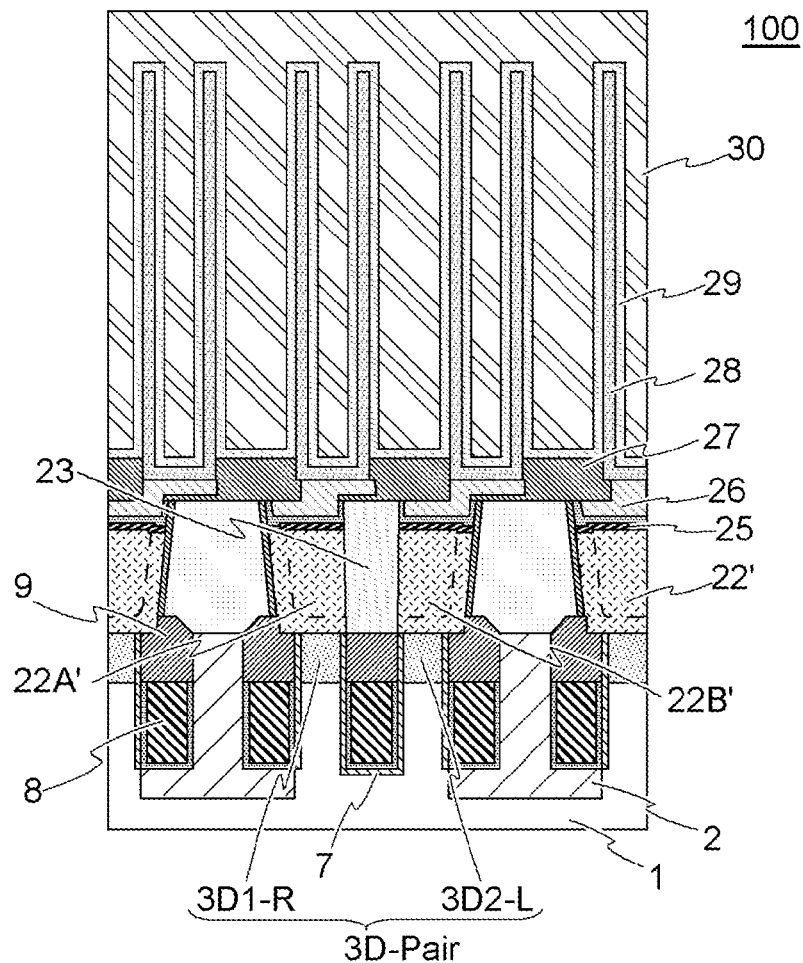
FIG. 29 is a drawing used to describe a step in the manufacture of a semiconductor device in one exemplary embodiment of the present invention, where (A) is a cross-sectional view through X1-X1' in (E), and (E) is a top view as seen through a portion of the insulating film.
Figure 29:
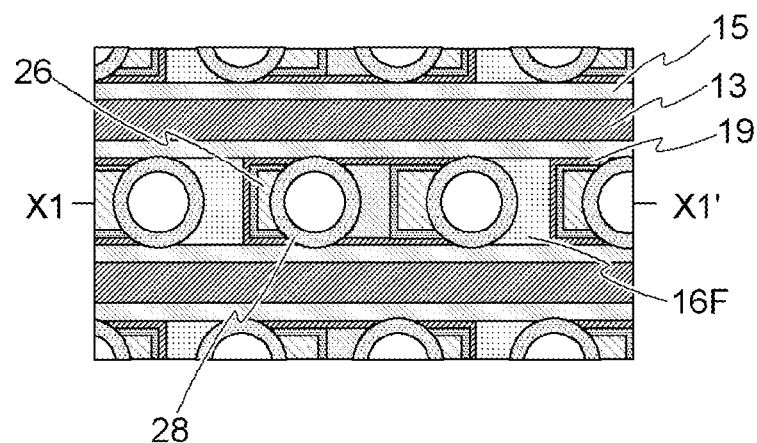

[Step in FIG. 28]

Further, a titanium nitride film, serving as a drain contact barrier material 26B, and a tungsten film, serving as a drain contact pad material 26M, are deposited successively on the silicide film 25 to thicknesses of 5 nm and 50 nm respectively. A mask, which is not shown in the drawings, is then formed, and the drain contact pad material 26M and the drain contact barrier material 26B are etched back until the first interlayer film fins 16F and the bit line hardmasks 13 are exposed, thereby forming drain contact pads 26 extending on the first interlayer film fins 16F.

[Step in FIG. 29]

A stopper film 27 is formed using a silicon nitride film in such a way as to cover the drain contact pads 26. Cylindrical lower electrodes 28 of capacitor elements are formed on the drain contact pads 26 using titanium nitride or the like. The lower electrodes 28 are formed by means of a step of forming a sacrificial interlayer film on the stopper film 27, a step of forming cylinder holes in the sacrificial interlayer film, a step of forming the lower electrodes 28, and a step of removing the sacrificial interlayer film.

A capacitative insulating film 29 is then formed in such a way as to cover the surfaces of the lower electrodes 28, after which an upper electrode 30 of the capacitor element is formed using titanium nitride or the like.

Multilayer wiring lines are then formed by repeatedly performing a wiring line forming step, which is not shown in the drawings, to form a semiconductor device 100.

As illustrated in this exemplary embodiment, when the silicide film 25 is formed in the step in FIG. 27, whereas in the background art the isolating and insulating film that has penetrated into the voids hinders siliciding, in the present invention voids into which the isolating and insulating film penetrates are not formed to a significant extent, and the silicide film 25 is therefore formed over the entire upper surfaces of the contact plugs. The contact resistance can thus be reduced yet further. It should be noted that the silicide film 25 is not essential, and may be omitted as appropriate.

Figure 30:
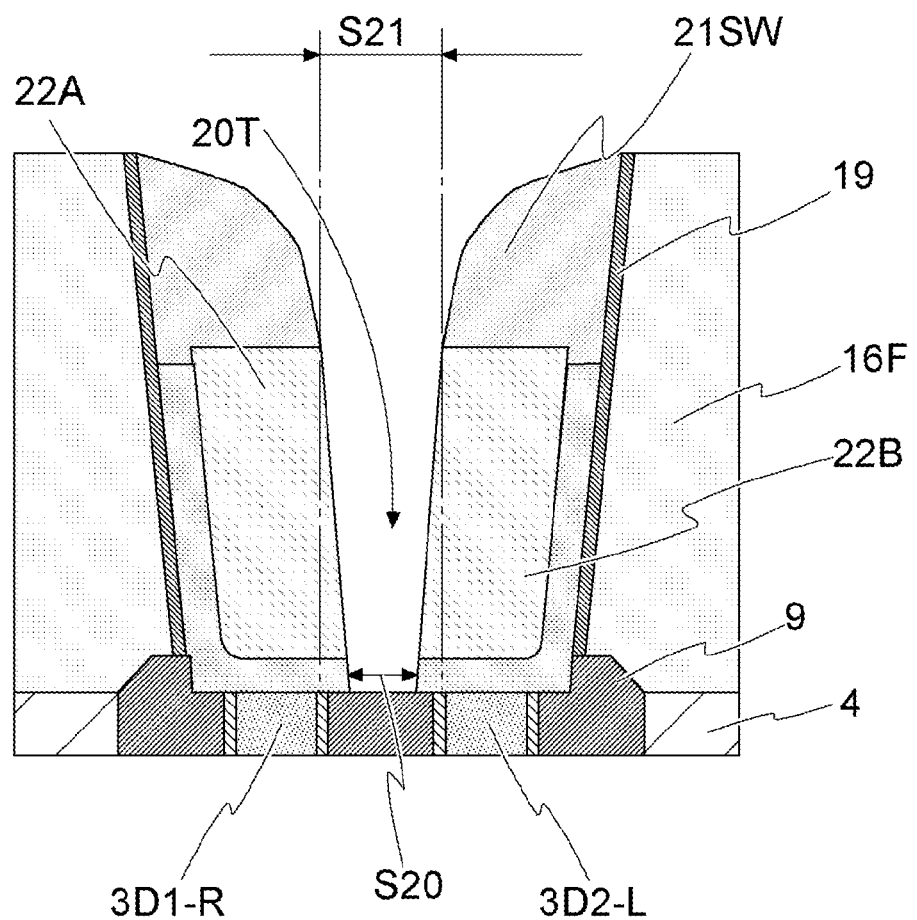
FIG. 30 is an enlarged cross-sectional view used to describe a step in the manufacture of a semiconductor device in a modified example of one exemplary embodiment of the present invention.

In this exemplary embodiment an example is illustrated in which the wall surfaces of the silicon groove 20T are formed substantially vertically (taper angle=0°), as illustrated in FIG. 22, but the wall surfaces may be formed with a tapered shape, as illustrated in a modified example in FIG. 30. Because the taper angle of the wall surfaces of the polysilicon groove 20T is normally smaller than the taper angle of the wall surfaces of the first interlayer film fins 16F, the surface areas of the upper surfaces of the contact plugs that are formed are larger than the surface areas of the lower surfaces thereof. It should be noted that FIG. 30 is an enlarged cross-sectional view corresponding to FIG. 22 (A).

Such etching is performed under conditions whereby the silicon nitride films are etched selectively relative to the silicon dioxide films, and is performed in such a way that the bit lines 12 and the first interlayer film fins 16F that are enveloped by the second side walls 19 remain. The embedded nitride film 9 in the upper portion of the separating portion gate trench is exposed at the bottom of the silicon groove 20T. The polysilicon groove 20T is preferably formed with a width S20 whereby the drain diffusion layers 3D are not exposed in the bottom of the polysilicon groove 20T. This is because by forming said groove in such a way that the drain diffusion layers 3D are not exposed, the first and second drain contact plugs 22A and 22B can be made to come into contact with the drain diffusion layers 3D1-R and 3D2-L respectively to the maximum extent in the X-direction, and the contact resistance can therefore be reduced. The opening width S20 is preferably formed in such a way that the tops of the drain diffusion layers 3D are not exposed even if alignment displacement occurs. In the modified example, the opening width S21 between the third side walls 21SW is 40 nm, whereas the opening width S20 at the bottom is 20 nm, to provide an alignment margin of 10 nm.

EXPLANATION OF THE REFERENCE CODES

1 Semiconductor substrate
  1P Semiconductor pillar
2 Element isolating film
  2P Insulator pillar
3 Diffusion layer
  3S Source diffusion layer (third diffusion region)
  3D Drain diffusion layer
  3D1-R Drain diffusion layer (first diffusion region)
  3D2-L Drain diffusion layer (second diffusion region)
4 Mask insulating film
5 First resist mask
  5A First resist opening portion
6 Gate trench
7 Gate insulating film
8 Embedded gate electrode
  8B Barrier layer
  8M Metal layer
9 Embedded nitride film
10 Second resist mask
11 Bit line contact opening portion
12 Bit line
  12a Bit line polysilicon film
  12b Bit line tungsten nitride film
  12c Bit line tungsten film
13 Bit line hardmask
15 First side wall
16 First interlayer film
  16F First interlayer film fin
17 Third resist mask
18 Drain contact hole
19 Second side wall
20a First silicon film
20b Second silicon film
20B Silicon filler body
  20T Silicon groove
  20SX, 20SY Seam
  20SL Slit
  20V Void
21 Third side wall film
  21SW Third side wall
  21A Third side wall opening portion
22 Drain contact plug
  22A First contact plug
  22B Second contact plug
23 Isolating and insulating film
25 Silicide film
26 Drain contact pad
  26B Drain contact barrier material
  26M Drain contact pad material
27 Stopper film
28 Lower electrode
29 Capacitative insulating film
30 Upper electrode
51 Substrate
52 First line pattern
53 Second line pattern
54 First space portion
55, 55' First silicon film
56 Second space portion
57, 57' Second silicon film
  57SX First seam
  57SY Second seam
  57SL Slit
58 Mask side wall
59 Silicon groove
60, 60' Contact plug
  60A, 60A' First contact plug
  60B, 60B' Second contact plug
61 Isolating and insulating film
100 Semiconductor device
S20 Width of bottom portion of silicon groove
S21 Width of third side wall opening
W21 Width of third side wall

What is claimed is:
1. A method of manufacturing a semiconductor, comprising:
  demarcating a first space portion by means of a plurality of first line patterns extending in a first direction, and a plurality of second line patterns extending over the plurality of first line patterns in a second direction which intersects the first direction;
  depositing a first silicon film, containing an impurity having a first concentration, to a thickness that does not fill the first space portion;
  depositing a second silicon film, containing an impurity having a second concentration, to a thickness that fills the first space portion and fills between the second line patterns;
  forming a silicon filler body by etching back the first and second silicon films in such a way as to make them lower than an upper surface of the second line pattern;
  forming masking films on each of the sidewalls of the second line patterns in such a way that a portion of the silicon filler body is exposed;
  selectively removing the silicon filler body, using the masking film as a mask, to form a first groove;

filling the first groove with an isolating and insulating film;

removing the masking film, a portion of the isolating and insulating film, and portions of the second line patterns in such a way that the upper surfaces of the silicon filler body that has been divided by the isolating and insulating film are exposed; and forming a second groove in the silicon filler body, and then employing heat treatment to bring the impurity concentration in the divided silicon filler body to a third concentration;

and in that the first concentration is higher than the third concentration, and the second concentration is lower than the third concentration.

2. The method of manufacturing a semiconductor device as claimed in claim 1, wherein the second groove is formed in such a way as to expose a joint in the second silicon film, in a central portion of the first space portion.

3. The method of manufacturing a semiconductor device as claimed in claim 2, wherein the relationship W2−WS>W1 is satisfied, where W1 is a gap between the first line patterns, W2 is a gap between the second line patterns, and WS is the width of the first groove (where W1, W2 and WS represent values in an identical plane).

4. The method of manufacturing a semiconductor device as claimed in claim 3, wherein the first silicon film has a film thickness at most equal to ¼ of the gap W1 between the first line patterns.

5. The method of manufacturing a semiconductor device as claimed in claim 1, wherein the third concentration is an impurity concentration sufficient to impart a required electrical conductivity to a final silicon plug formed from the divided silicon filler body.

6. The method of manufacturing a semiconductor device as claimed in claim 5, wherein the second concentration is at least 15% lower than the third concentration.

7. The method of manufacturing a semiconductor device as claimed in claim 5, wherein the following relationships are satisfied:

$$V1+V2=100\%$$

$$C1 \times V1 + C2 \times V2 = C3$$

where V1 (%) is the volume fraction of the first silicon film in the final silicon plug, C1 is the first concentration, V2 (%) is the volume fraction of the second silicon film in the final silicon plug, C2 is the second concentration, and C3 is the third concentration.

8. The method of manufacturing a semiconductor device as claimed in claim 7, wherein the first concentration is 7E20 to 1.5E21 atoms/cm$^3$, and the second concentration is 4E20 to 5E20 atoms/cm$^3$.

9. The method of manufacturing a semiconductor device as claimed in claim 1, wherein bringing the impurity concentration in the silicon filler body to the third concentration is combined with heat treatment.

10. The method of manufacturing a semiconductor device as claimed in claim 1, wherein the second line patterns are formed with an inclined side-surface shape such that an upper portion is wider than a bottom portion.

11. The method of manufacturing a semiconductor device as claimed in claim 10, wherein the width of a bottom portion of the second groove is less than a width of an opening upper portion thereof.

12. The method of manufacturing a semiconductor device as claimed in claim 1, wherein the first space portion is formed on a semiconductor substrate, and is formed exposing first and second diffusion regions which are separated from one another.

13. The method of manufacturing a semiconductor device as claimed in claim 12, wherein the first line pattern contains a wiring line connected to a third diffusion region formed on the semiconductor substrate.

14. The method of manufacturing a semiconductor device as claimed in claim 13, comprising:

forming on the semiconductor substrate a plurality of element isolation regions extending in a third direction that is different from the first and second directions, and defining an active region extending in the third direction, between the element isolation regions;

implanting an impurity having the opposite conduction type to the semiconductor substrate into the surface of the active region to form a diffusion region;

forming a plurality of embedded word lines extending in the second direction, and repeatedly dividing the diffusion region in the order first diffusion region, third diffusion region, second diffusion region;

forming, as the first line pattern, a bit line which is connected to the third diffusion region, and an upper portion and a side surface of which are covered by an insulating film; and depositing an insulating film covering the bit line and removing the insulating film that extends over and between a first diffusion region and a second diffusion region that are adjacent to one another, in such a way that the insulating film above the third diffusion region remains, to form the second line patterns.

15. The method of manufacturing a semiconductor device as claimed in claim 14, comprising making the upper surfaces of the divided silicon filler body lower than the upper surfaces of the remaining first and second line patterns.

16. The method of manufacturing a semiconductor device as claimed in claim 14, comprising depositing a silicidable metal film on the exposed upper surfaces of the divided silicon filler body, and heat-treating said silicidable metal film to form a silicide film.

17. The method of manufacturing a semiconductor device as claimed in claim 14, comprising forming pad electrodes, electrically connected to the respective upper surfaces of the divided silicon filler body.

18. The method of manufacturing a semiconductor device as claimed in claim 17, comprising forming capacitors in contact with the pad electrodes.

19. The method of manufacturing a semiconductor device as claimed in claim 18, wherein forming the capacitors includes forming cylindrical lower electrodes in contact with the pad electrodes.

\* \* \* \* \*